(12) United States Patent
Hayashi et al.

(10) Patent No.: US 10,818,579 B2
(45) Date of Patent: Oct. 27, 2020

(54) LEAD FRAME AND ELECTRONIC COMPONENT DEVICE

(71) Applicant: SHINKO ELECTRIC INDUSTRIES CO., LTD., Nagano-shi, Nagano (JP)

(72) Inventors: Shintaro Hayashi, Nagano (JP); Kentaro Kaneko, Nagano (JP); Tsukasa Nakanishi, Nagano (JP); Misaki Imai, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 25 days.

(21) Appl. No.: 16/160,012

(22) Filed: Oct. 15, 2018

(65) Prior Publication Data
US 2019/0115288 A1  Apr. 18, 2019

(30) Foreign Application Priority Data
Oct. 18, 2017 (JP) .................. 2017-201843

(51) Int. Cl.
*H01L 23/495* (2006.01)
*H01L 21/48* (2006.01)

(52) U.S. Cl.
CPC .... *H01L 23/49534* (2013.01); *H01L 21/4828* (2013.01); *H01L 23/49548* (2013.01); *H01L 23/49582* (2013.01); *H01L 23/49586* (2013.01); *H01L 23/49513* (2013.01); *H01L 2224/16245* (2013.01); *H01L 2224/32245* (2013.01); *H01L 2224/48091* (2013.01); *H01L 2224/48247* (2013.01); *H01L 2224/73265* (2013.01); *H01L 2924/181* (2013.01)

(58) Field of Classification Search
CPC ........................................ H01L 23/495–49596
See application file for complete search history.

(56) References Cited

U.S. PATENT DOCUMENTS

| | | | | |
|---|---|---|---|---|
| 5,847,458 | A | * | 12/1998 | Nakamura .......... H01L 21/4828 257/738 |
| 7,344,920 | B1 | * | 3/2008 | Kirloskar ............ H01L 21/4828 438/123 |
| 2009/0034225 | A1 | * | 2/2009 | Shoji ....................... H01L 24/90 361/809 |
| 2018/0061746 | A1 | * | 3/2018 | Hayashi .............. H01L 23/3121 |

FOREIGN PATENT DOCUMENTS

| JP | H09-307043 | 11/1997 |
|---|---|---|
| JP | 2012-164877 | 8/2012 |

* cited by examiner

*Primary Examiner* — Zandra V Smith
*Assistant Examiner* — Molly K Reida
(74) *Attorney, Agent, or Firm* — Rankin, Hill & Clark LLP

(57) ABSTRACT

There is provided a lead frame. The lead frame includes: a die pad; a lead terminal that is separated from the die pad and disposed around the die pad; and a resin layer that is formed between the die pad and the lead terminal so as to fix the die pad and the lead terminal. The resin layer has an opening portion that exposes at least a lower surface of the lead terminal.

10 Claims, 32 Drawing Sheets

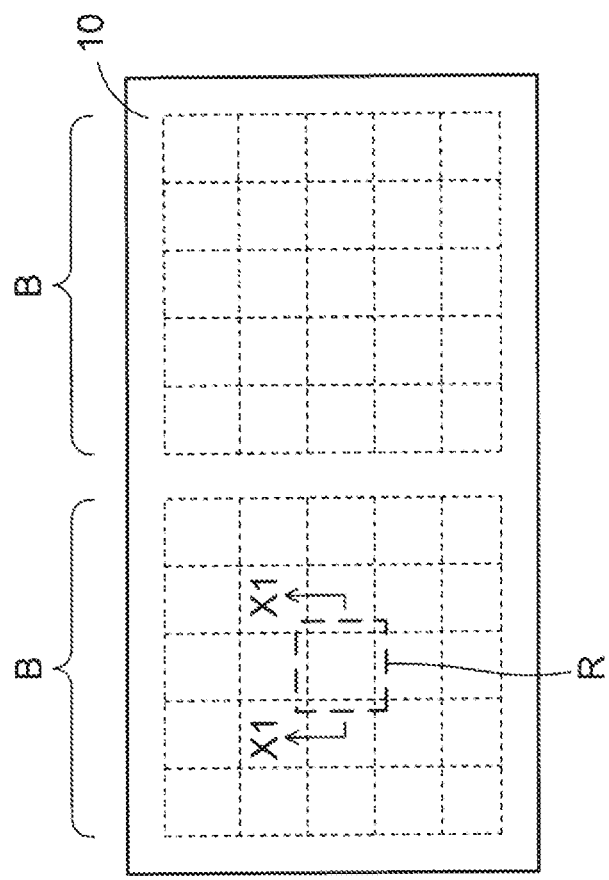
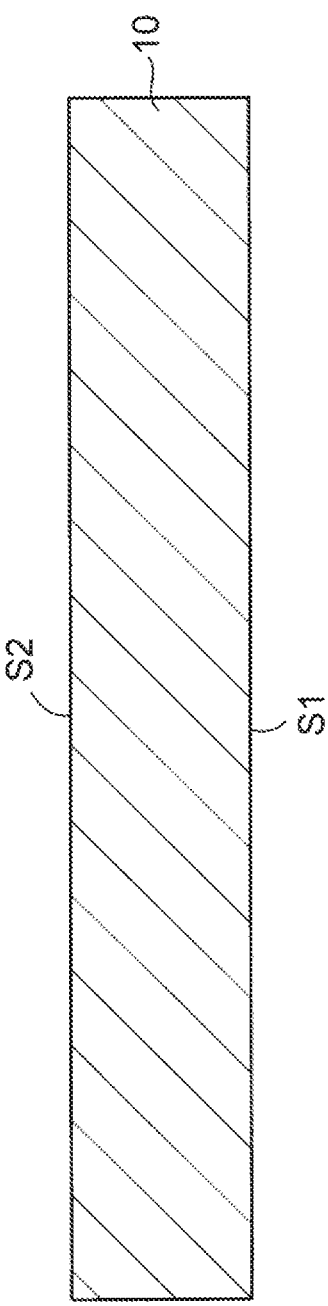
FIG. 1A
FIG. 1B

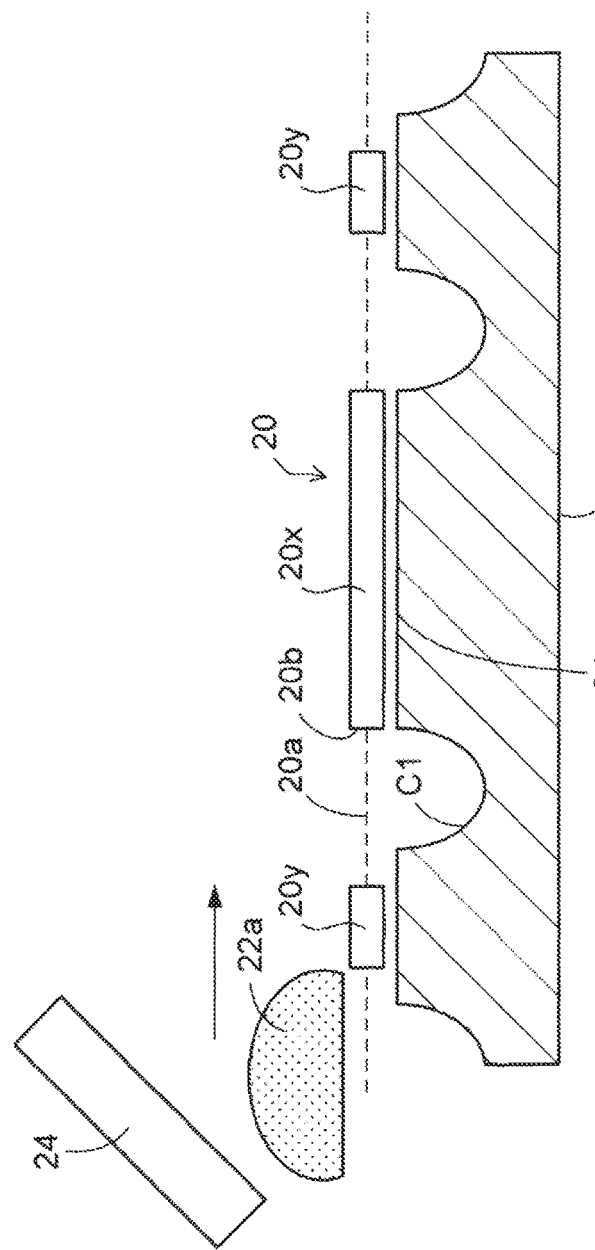
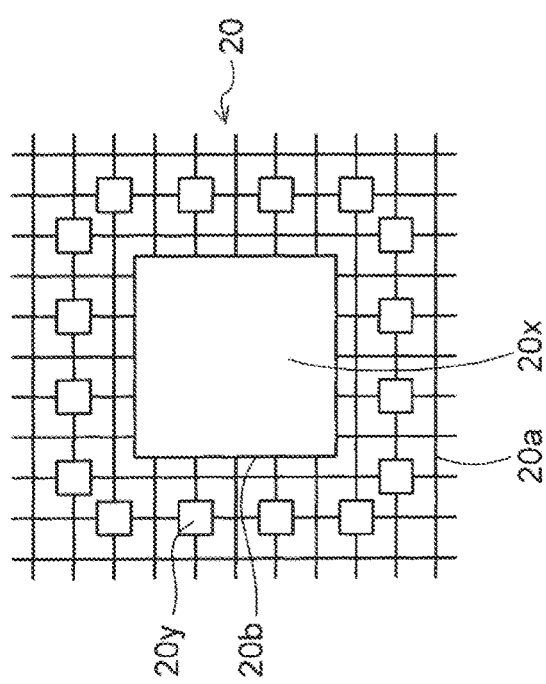
FIG. 7A
FIG. 7B

LEAD FRAME AND ELECTRONIC COMPONENT DEVICE

This application claims priority from Japanese Patent Application No. 2017-201843 filed on Oct. 18, 2017, the entire contents of which are herein incorporated by reference.

BACKGROUND

1. Technical Field

Embodiments of the present disclosure relate to a lead frame and an electronic component device.

2. Background Art

In the background art, there are lead frames for mounting electronic components such as semiconductor chips thereon. In such a lead frame, a semiconductor chip mounted on a die pad is connected to ambient leads by wires, and the semiconductor chip and the wires are sealed with a sealing resin (see e.g., JP-A-9-307043 and JP-A-2012-164877).

In the background art, there are QFN (Quad Flat Non-Lead package) type lead frames. Such a lead frame is manufactured as follows. That is, a metal plate shaped like a thin plate with a thickness of about 0.1 mm to about 0.25 mm is etched to form patterns of a die pad, leads, etc., and then plated with metal.

In this manner, the QFN type lead frame is formed from the metal plate shaped like the thin plate. Therefore, in some cases, the patterns may be easily deformed in the manufacturing process so that the lead frame cannot be manufactured reliably.

SUMMARY

Certain embodiments provide a lead frame. The lead frame comprises: a die pad; a lead terminal that is separated from the die pad and disposed around the die pad; and a resin layer that is formed between the die pad and the lead terminal so as to fix the die pad and the lead terminal. The resin layer has an opening portion that exposes at least a lower surface of the lead terminal.

Certain embodiments provide an electronic component device. The electronic component device comprises a lead frame, an electronic component, and a sealing resin. The lead frame comprises: a die pad; a lead terminal that is separated from the die pad and disposed around the die pad; and a resin layer that is formed between the die pad and the lead terminal so as to fix the die pad and lead terminal. The resin layer has an opening portion that exposes at least a lower surface of the lead terminal. The electronic component is disposed on the die pad and electrically connected to the lead terminal. The sealing resin seals the lead frame and the electronic component.

BRIEF DESCRIPTION OF DRAWINGS

FIG. 1A is a plan view showing a lead frame manufacturing method according to a first embodiment (Part 1);

FIG. 1B is a sectional view showing a lead frame manufacturing method according to a first embodiment (Part 1);

FIG. 7A is a sectional view showing the lead frame manufacturing method according to the first embodiment (Part 7);

FIG. 7B is a plan view showing the lead frame manufacturing method according to the first embodiment (Part 7);

DETAILED DESCRIPTION

Embodiments will be described below with reference to the accompanying drawings.

First Embodiment

Figure 15:
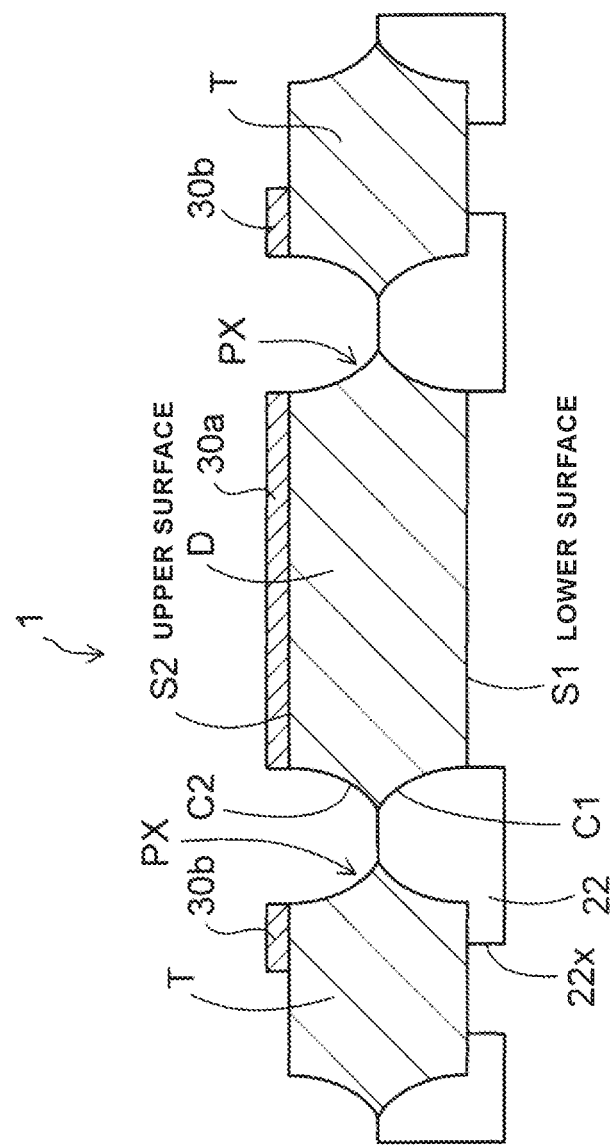
FIG. 15 is a sectional view showing a lead frame according to the first embodiment.
Figure 16:
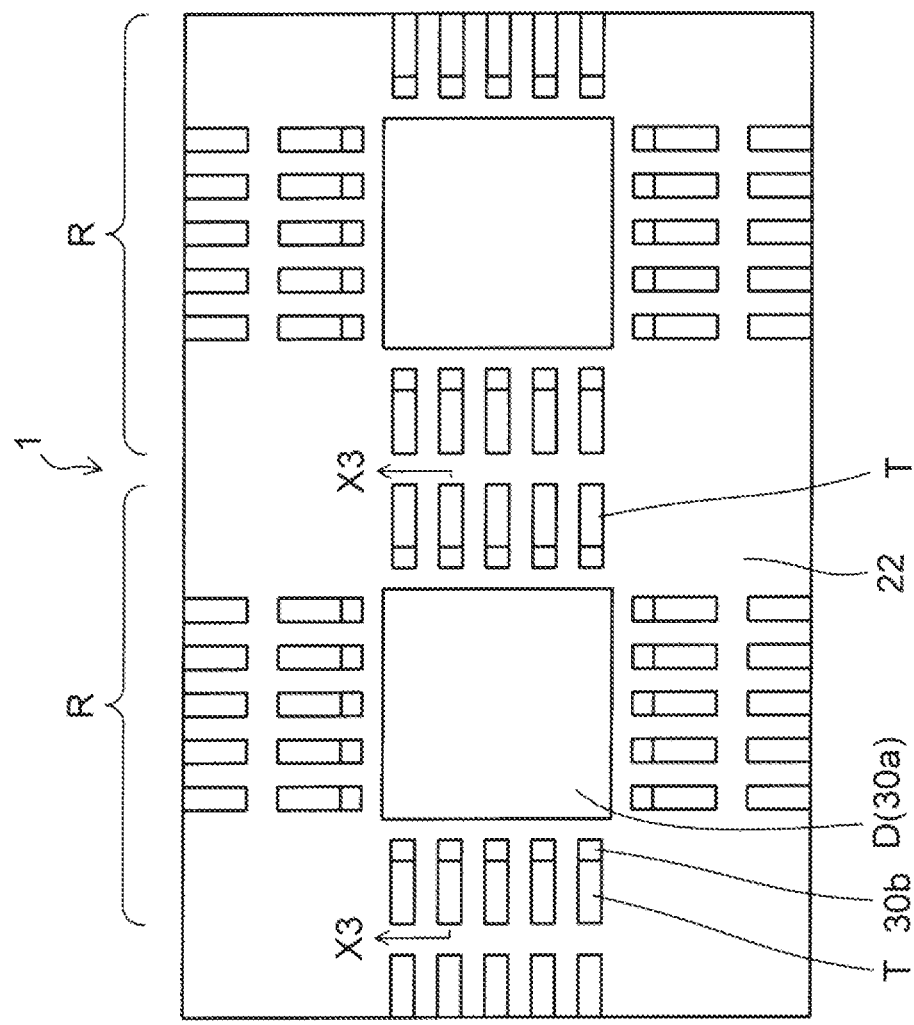
FIG. 16 is a plan view of the lead frame in FIG. 15 when seen from an upper surface side.
Figure 17:
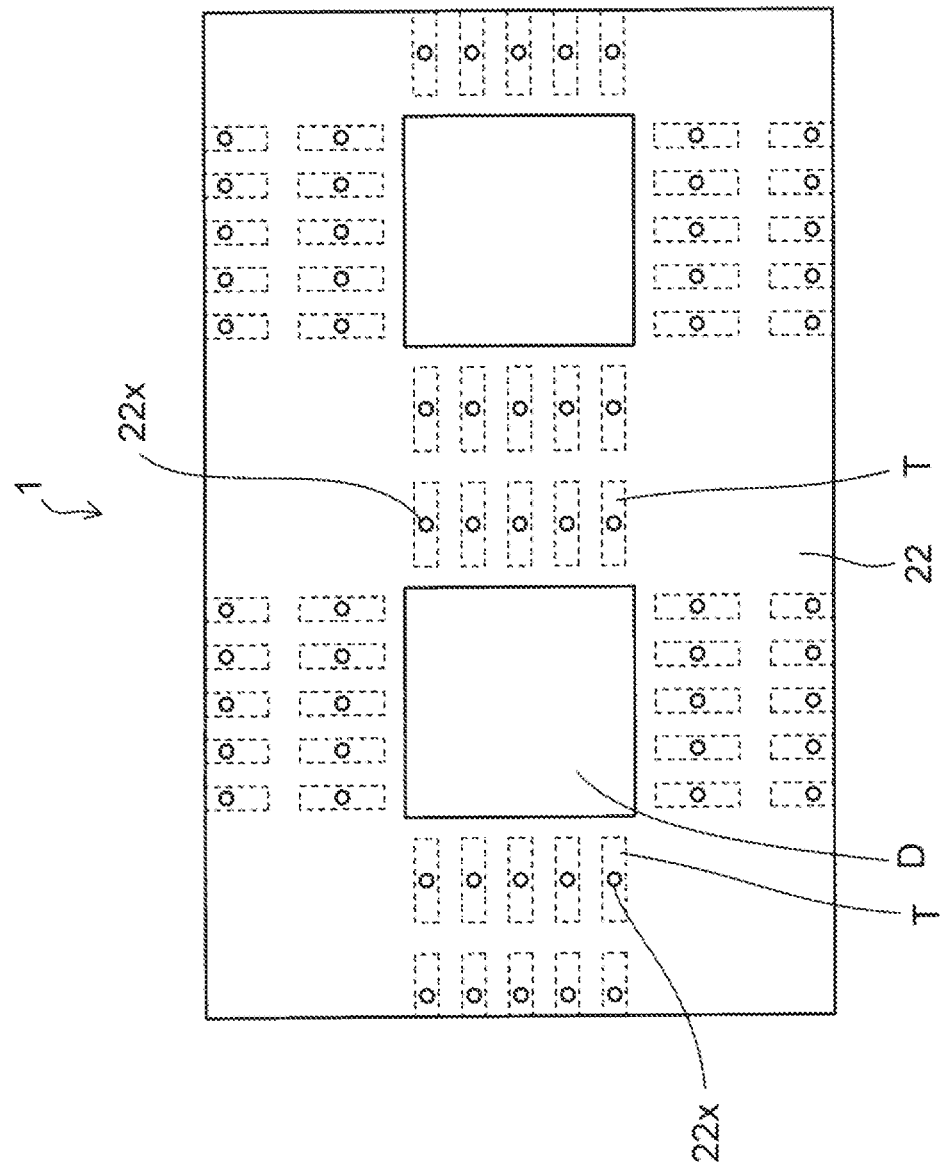
FIG. 17 is a plan view of the lead frame in FIG. 15 when seen from a lower surface side.

FIGS. 1A to 14 are views for explaining a lead frame manufacturing method according to a first embodiment. FIGS. 15 to 17 are views for explaining a lead frame according to the first embodiment. FIGS. 18 to 21 are views for explaining an electronic component device according to the first embodiment.

The structures of the lead frame and the electronic component device will be described below while the lead frame manufacturing method is described.

In the lead frame manufacturing method according to the first embodiment, first, a metal plate 10 is prepared, as shown in FIG. 1A. In the metal plate 10, a plurality of block regions B are defined, and a plurality of product regions R are defined in each of the block regions B. FIG. 1B is a partial enlarged sectional view taken along a line X1-X1 of one of the product regions R inside the block region B of the metal plate 10 in FIG. 1A.

In the following manufacturing method, a sectional portion of the product region R of the metal plate 10 in FIG. 1B will be shown and described. The metal plate 10 is made of a copper alloy plate etc. shaped like a thin plate with a thickness of about 0.1 mm to about 0.25 mm.

The metal plate 10 includes a first surface S1 and a second surface S2 provided on an opposite side of the first surface S1. The metal plate 10 is patterned into a lead frame. The first surface S1 of the metal plate 10 corresponds to a lower surface of the lead frame, and the second surface S2 of the metal plate 10 corresponds to an upper surface of the lead frame.

Figure 2:
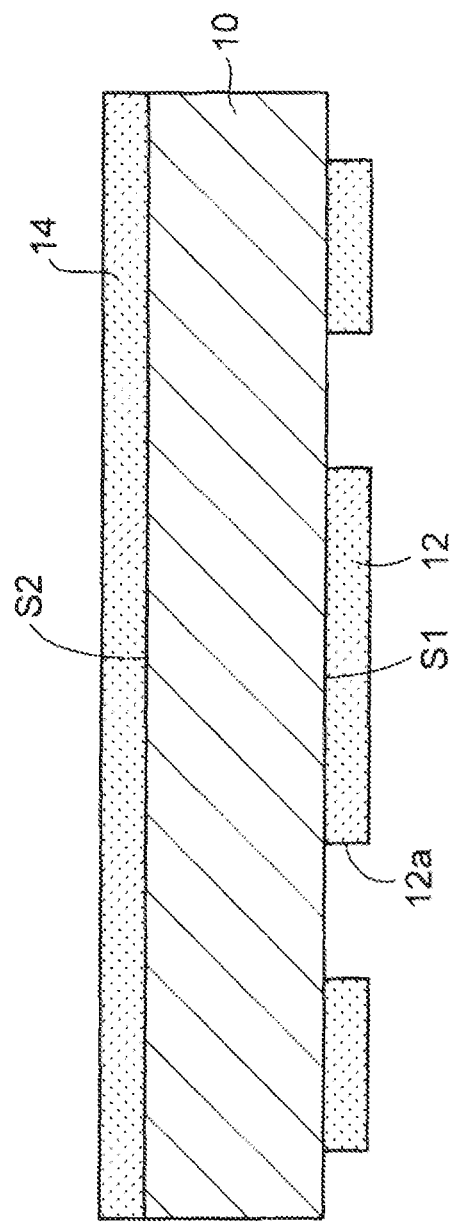
FIG. 2 is a sectional view showing the lead frame manufacturing method according to the first embodiment (Part 2)

Next, as shown in FIG. 2, a first resist layer 12 provided with an opening portion 12a is formed on the first surface S1 of the metal plate 10. The opening portion 12a is formed in the first resist layer 12 by exposing the first resist layer 12 to light and developing the first resist layer 12 based on photolithograph. Further, a second resist layer 14 is formed on the entire second surface S2 of the metal plate 10.

Figure 3:
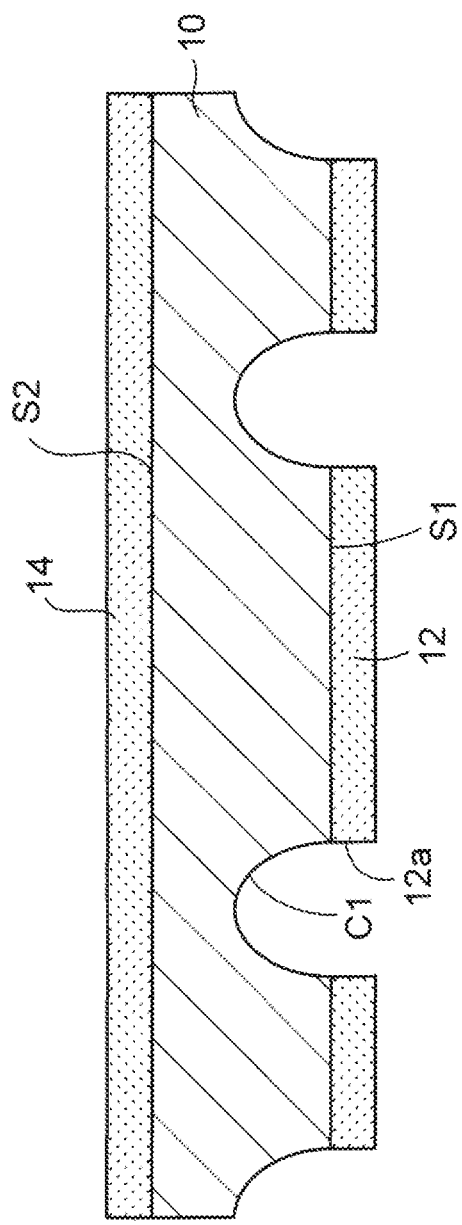
FIG. 3 is a sectional view showing the lead frame manufacturing method according to the first embodiment (Part 3)

Successively, shown in FIG. 3, the metal plate 10 is wet-etched from the first surface S1 side up to the thickness-wise middle through the opening portion 12a of the first resist layer 12. Thus, a first cavity C1 is formed in the metal plate 10. When, for example, a depth of the first cavity C1 is set at about half the thickness of the metal plate 10 and the thickness of the metal plate 10 is about 0.2 mm, the depth of the first cavity C1 is set at about 0.1 mm.

When the metal plate 10 is made of a copper alloy, a cupric chloride solution, a ferric chloride solution, or the like, is used as a wet etching solution.

Figure 4A:
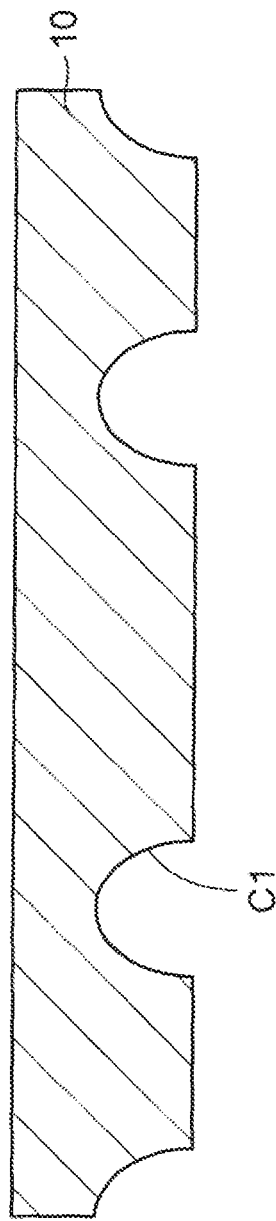
FIG. 4A is a sectional view showing the lead frame manufacturing method according to the first embodiment (Part 4)
Figure 4B:
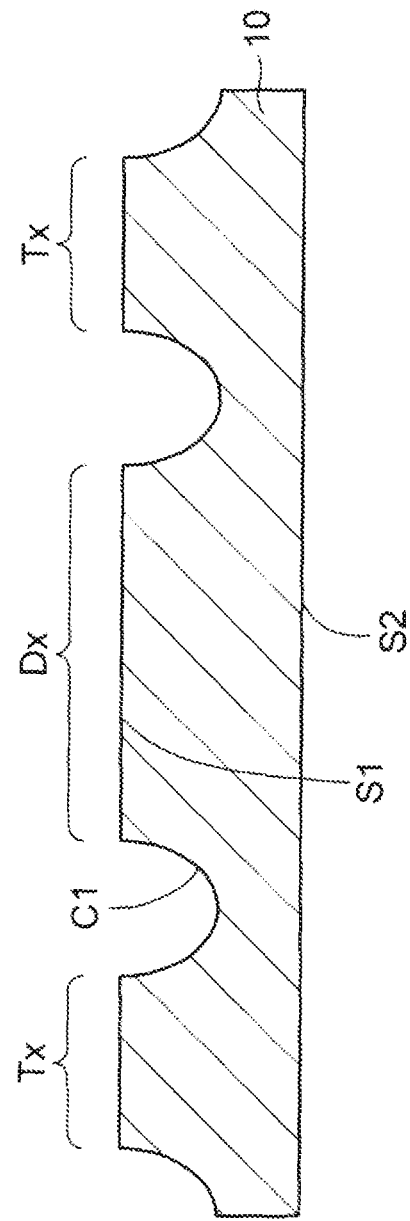
FIG. 4B is a sectional view showing the lead frame manufacturing method according to the first embodiment (Part 4)

Then, as shown in FIG. 4A, the first resist layer 12 and the second resist layer 14 are removed. FIG. 4B shows a state in which the metal plate 10 in FIG. 4A is inverted vertically so that the first surface S1 where the first cavity C1 has been formed faces up.

Figure 5:
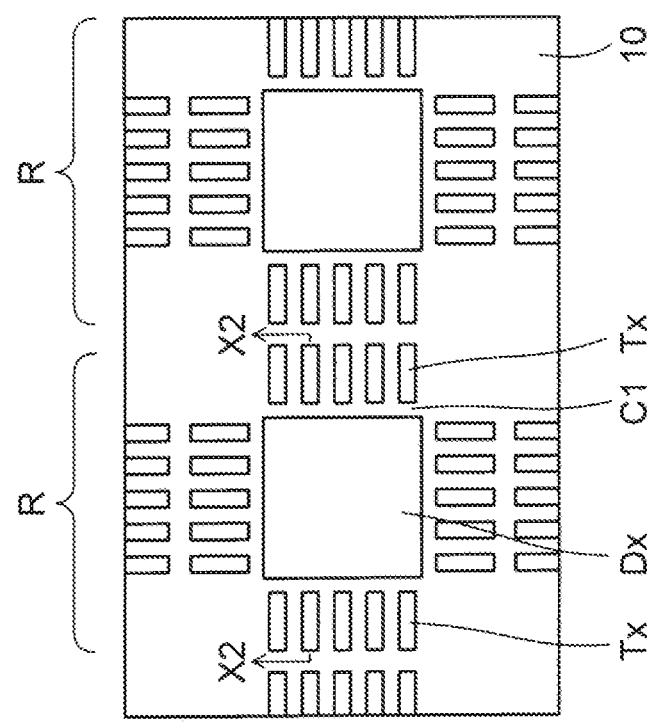
FIG. 5 is a plan view showing the lead frame manufacturing method according to the first embodiment (Part 5)

FIG. 5 is a reduced plan view of patterns defined by the first cavities C1 of the metal plate 10 in FIG. 4B when seen from the upper side. FIG. 5 shows a portion corresponding to two product regions R arranged side by side in a lateral direction of FIG. 1A. FIG. 4B corresponds to a section taken along a line X2-X2 of FIG. 5.

FIG. 5 shows the patterns defined by the first cavities C1 of the metal plate 10 when the lead frame from which support bars and sewing bars have been omitted is manufactured.

Refer to the plan view of FIG. 5 in addition to FIG. 4B. In this case, square die pad regions Dx are defined by the first cavities C1 at central portions of the product regions R. In addition, a plurality of lead terminal regions Tx are defined by each of the first cavities C1 to be arranged side by side and around the die pad region Dx.

As will be described later, the metal plate 10 in FIG. 4B is etched from the second surface S2 side with the same patterns as the first cavities C1, and the etched surface of the metal plate 10 touches the first cavities C1. As a result, the metal plate 10 is penetrated. Thus, a die pad is obtained from each of the die pad regions Dx in FIG. 5, and lead terminals are obtained from the lead terminal regions Tx.

Next, a manufacturing method of a lead frame according to a modification of the invention will be described. The lead frame according to the modification is manufactured to include support bars and sewing bars.

Figure 6:
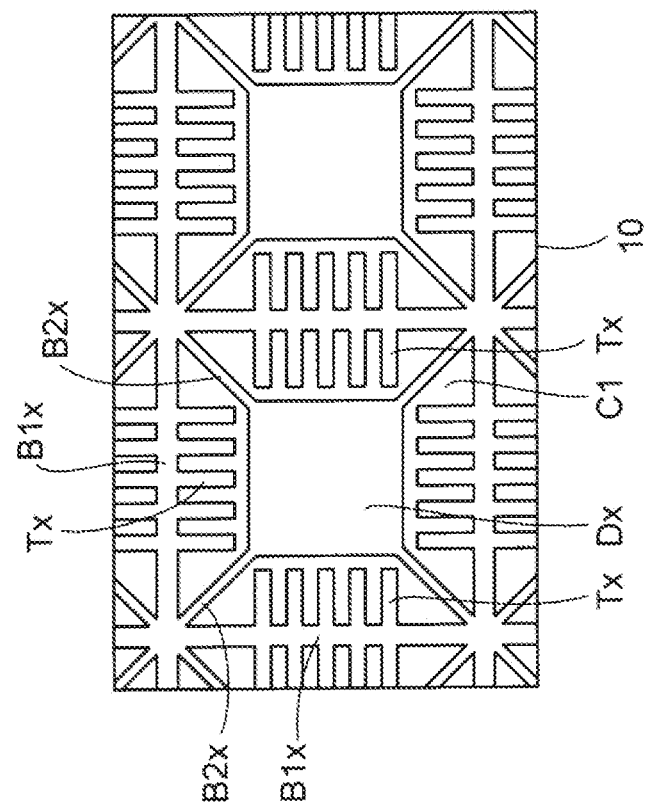
FIG. 6 is a plan view showing the lead frame manufacturing method according to the first embodiment (Part 6)

FIG. 6 shows patterns defined by first cavities C1 of a metal plate in manufacturing the lead frame according to the modification. As shown in FIG. 6, when the lead frame according to the modification is manufactured, a frame-like sawing bar region B1x is provided around each of die pad regions Dx, and a plurality of lead terminal regions Tx are connected to the sawing bar region B1x.

In addition, support bar regions B2x are connected to four corners of the die pad region Dx. The support bar regions B2x are connected to inner sides of four corners of the sawing bar region B1x.

Also in FIG. 6, the metal plate 10 in FIG. 4B is etched from a second surface S2 side, the sawing bars for supporting lead terminals are obtained from the sawing bar region B1x, and the support bars for supporting a die pad are obtained from the support bar regions B2x.

The sawing bar region B1x and the support bar regions B2x are formed in order to obtain the sawing bars and the support bars which can serve as power feed routes for electrolytic plating. The sawing bars and the support bars can function as the plating power feed routes for electrolytic plating. That is, the sawing bars and the support bars may not have mechanical strength for supporting the die pad and the lead terminals.

As will be described later, after the metal plate 10 is penetrated to form the die pad and the lead terminals, the sawing bars and the support bars electrically connected to the die pad and the lead terminals are needed when metal plating layers, solder layers, or the like, are formed by electrolytic plating.

Compare FIG. 5 and FIG. 6 with each other. The sawing bar region B1x and the support bar regions B2x in FIG. 6 are omitted in FIG. 5.

In the embodiment, before the metal plate 10 in FIG. 4B is etched from the second surface S2 side to be penetrated, a resin layer is formed on the first cavity C1 which has been formed in a first surface S1 of the metal plate 10 so as to fix the metal plate 10. Therefore, when the metal plate 10 is etched from the second surface S2 side to be penetrated, the die pad and the lead terminals can be fixed by the resin layer even without the sawing bars and the support bars.

Therefore, the sawing bar region B1x and the support bar regions B2x are omitted in FIG. 5. When the sawing bars and the support bars are omitted from the lead frame, a region around the die pad can be effectively utilized.

Thus, the region where product patterns of the lead terminals in the lead frame can be disposed can increase. Accordingly, the degree of freedom for design of the lead frame can be enhanced.

In addition, due to the omission of the sawing bars from the lead frame, burs can be prevented from being generated when the sawing bars are cut, and the life of a cutting blade of a cutting device can be elongated.

In the following manufacturing method e aforementioned pattern of the first cavity C1 of the metal plate 10 in FIG. 5 will be used in order to describe the manufacturing method of the lead frame from which the saw bars and the support bars have been omitted.

Incidentally, the embodiment may be applied to manufacturing of the lead frame including the sawing bars and the support bars.

Successively, as shown in FIGS. 7A and 7B, a screen mask 20 is prepared. FIG. 7B is a partial reduced plan view of the screen mask 20 in FIG. 7A when seen from the upper side.

As shown in FIGS. 7A and 7B, the screen mask 20 includes a mesh 20a made of stainless steel etc., and a first emulsion layer 20x and second emulsion layers 20y disposed at predetermined positions of the mesh 20a. The first and second emulsion layers 20x and 20y are formed out of a photosensitive resin patterned by photolithography.

In the screen mask 20, the first emulsion layer 20x is disposed on a portion corresponding to the die pad region Dx in FIG. 5, and the second emulsion layers 20y are disposed on portions corresponding to central portions of the lead terminal regions Tx.

As shown in FIG. 7A, the screen mask 20 is disposed on the first surface S1 where the first cavity C1 of the metal plate 10 in FIG. 4B has been formed. Further, a liquid or paste-like resin material 22a is disposed on the screen mask 20, and then, the resin material 22a is moved in the lateral direction by a squeegee 24.

On this occasion, the resin material 22a is disposed to be extruded downward from an opening portion 20b of the mesh 20a where the first and second emulsion layers 20x and 20y have not been disposed. On the other hand, the first and second emulsion layers 20x and 20y function as a mask for blocking formation of the resin material 22a. Accordingly, the resin material 22a is not formed in regions where the first and second emulsion layers 20x and 20y have been disposed.

Various kinds of insulating resins such as an epoxy resin and an acrylic resin can be used as the resin material 22a. A solder resist is used as a preferable example of the resin material 22a.

Figure 8:
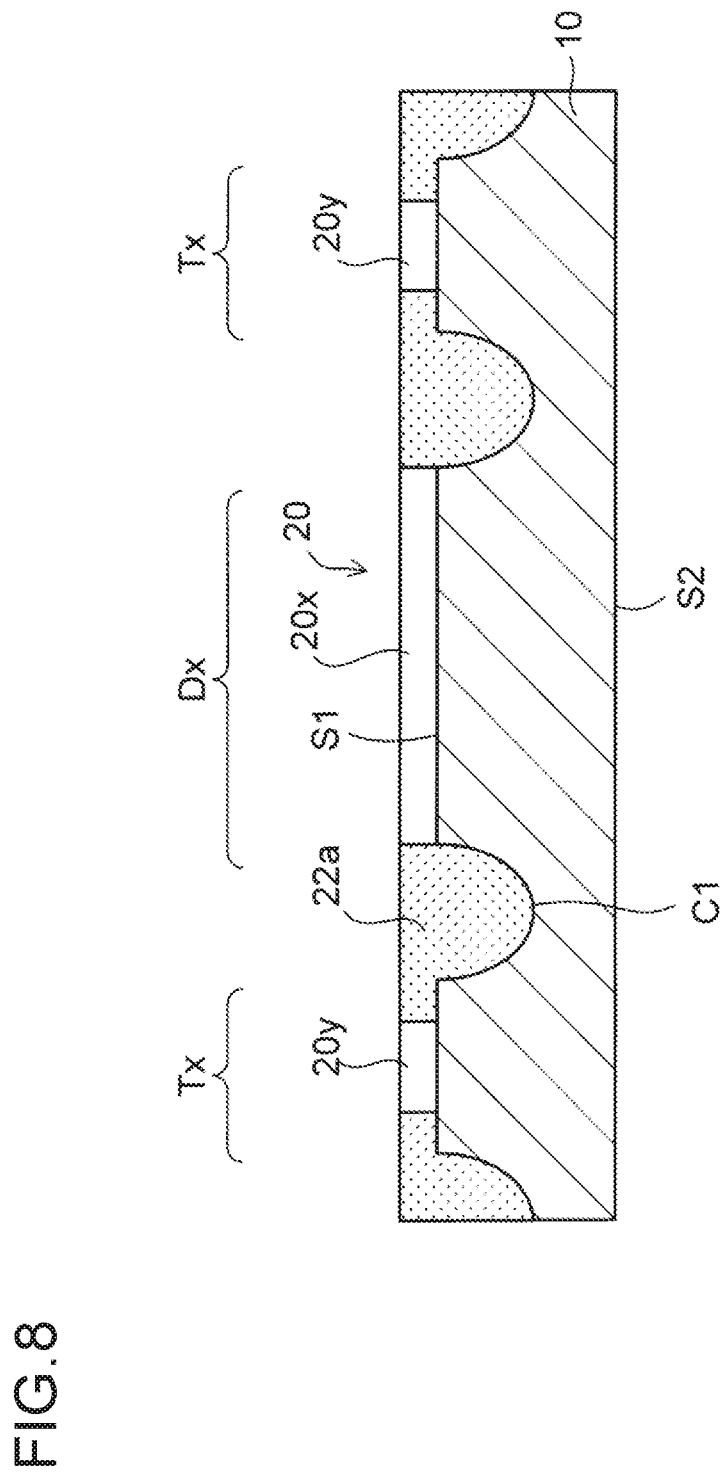
FIG. 8 is a sectional view showing the lead frame manufacturing method according to the first embodiment (Part 8)

Thus, as shown in FIG. 8, the resin material 22a is formed to be filled in a region extending from the inside of the first cavity C1 of the first surface S1 of the metal plate 10 to upper surfaces of the lead terminal regions Tx excluding their central portions.

Figure 9A:
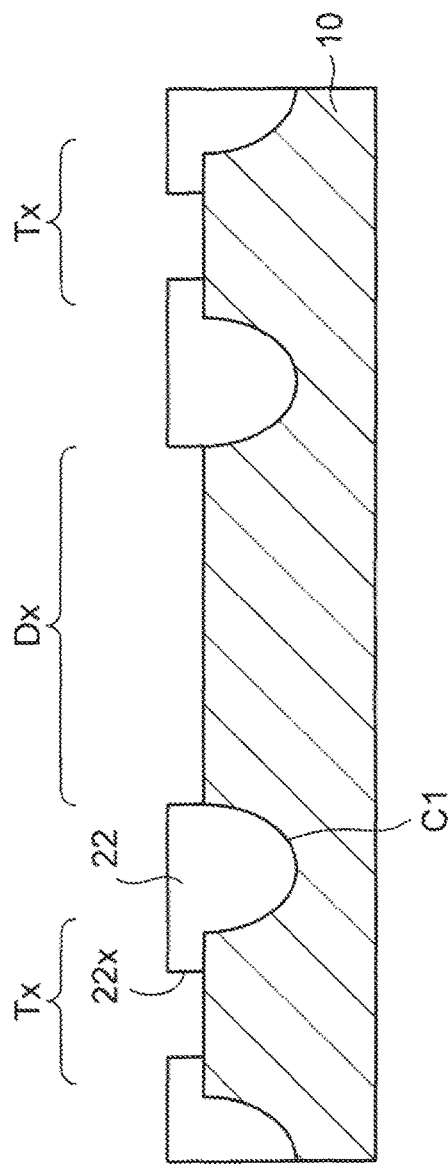
FIG. 9A is a sectional view showing the lead frame manufacturing method according to the first embodiment (Part 9)

Then, as shown in FIG. 9A, the screen mask 20 is removed from the metal plate 10. Further, when the resin material 22a formed on the metal plate 10 is subjected to heat treatment, the resin material 22a is cured so that the resin layer 22 is obtained.

Figure 9B:
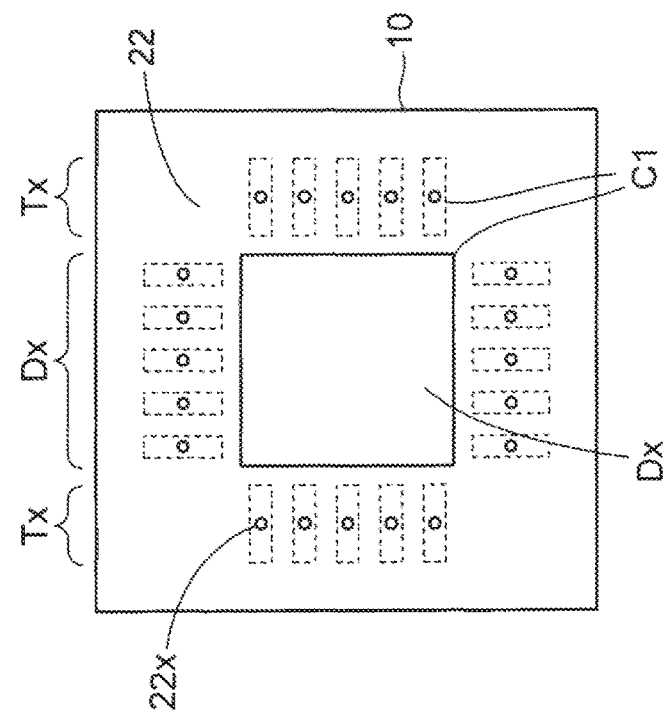
FIG. 9B is a plan view showing the lead frame manufacturing method according to the first embodiment (Part 9)

As shown in a reduced plan view of FIG. 9B, the resin layer 22 is formed integrally to extend from the outer circumference of the die pad region Dx and fill the first cavity C1 in the ambient region around the die pad region Dx.

In addition, the resin layer 22 is disposed to extend from the first cavity C1 to the lead terminal regions Tx, and opening portions 22x of the resin layer 22 are disposed at the central portions of the lead terminal regions Tx. The opening portions 22x of the resin layer 22 can be disposed on any portions, that serve as connection portions, on the lead terminal regions Tx.

The lead terminal regions Tx are covered with the resin layer 22. One portions of the lead terminal regions Tx are exposed from the opening portions 22x of the resin layer 22. In addition, the die pad region Dx is exposed from the resin layer 22.

Thus, the die pad region Dx and the lead terminal regions Tx are integrally fixed by the resin layer 22. Thus, even when the metal plate 10 shaped like a thin plate and weak in rigidity is used, the metal plate 10 is reinforced by the resin layer 22. Accordingly, the metal plate 10 can be prevented from being deformed by any post manufacturing step.

In the aforementioned printing by the squeegee 24 in FIG. 7A, the printing surface is made to face up in order to be subjected to processing. In the etching step or the plating step other than the printing step, the processing surface may be made to face in any of an up direction, a down direction and a sideway direction in order to be subjected to processing.

Figure 10:
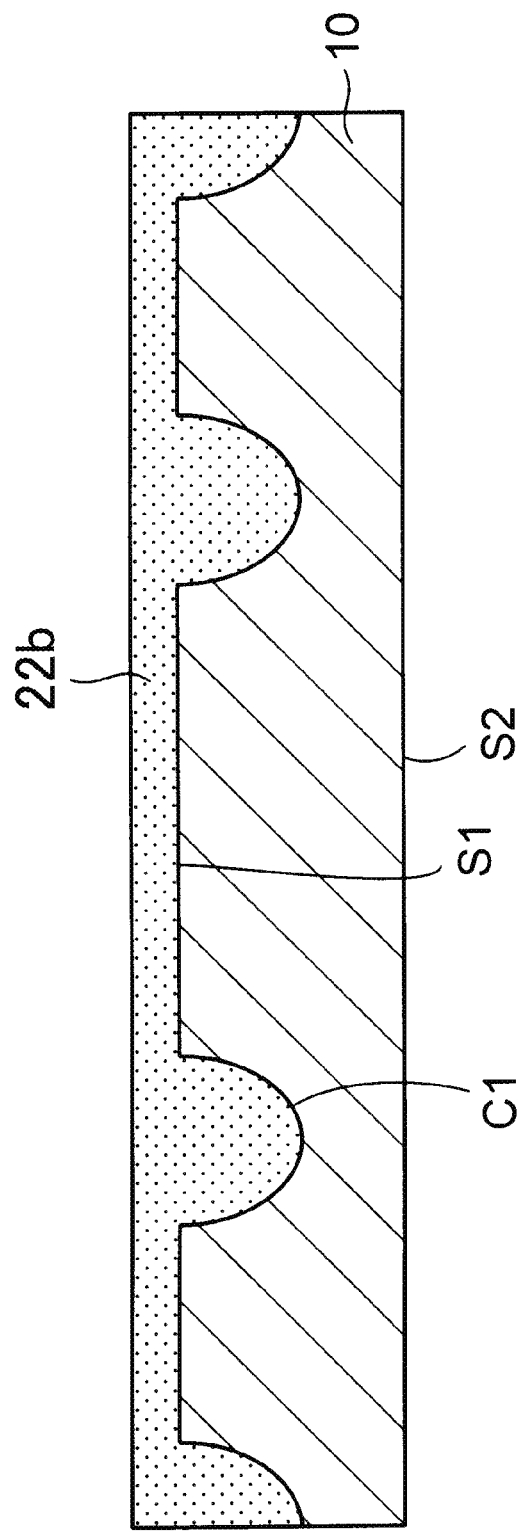
FIG. 10 is a sectional view showing the lead frame manufacturing method according to the first embodiment (Part 10)
Figure 11:
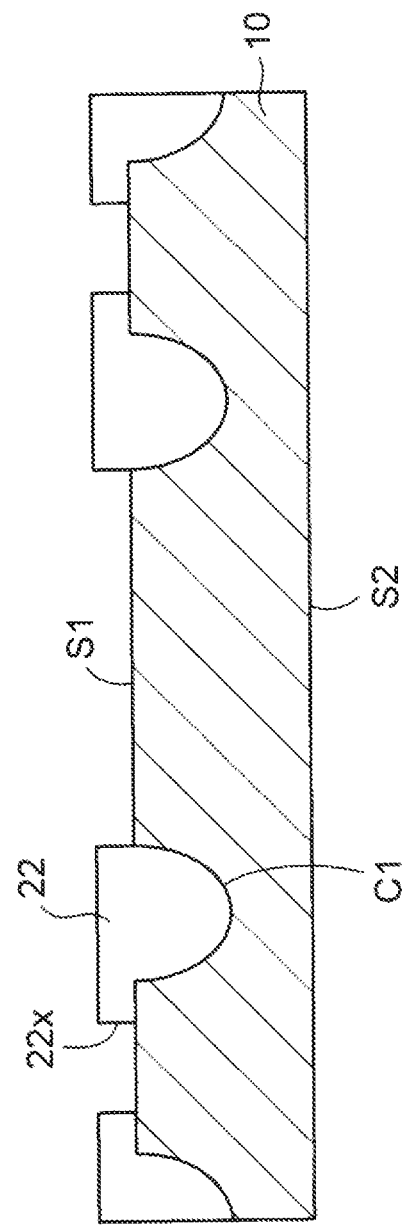
FIG. 11 is a sectional view showing the lead frame manufacturing method according to the first embodiment (Part 11)

FIG. 10 and FIG. 11 show another formation method of the resin layer 22. In the aforementioned method of FIGS. 7A to 9B, the screen mask 20 and the squeegee 24 are used so that the resin layer 22 is patterned and formed.

The resin layer 22 may be formed by another method than this method, i.e. by patterning a photosensitive resin layer by photolithography. An epoxy resin, an acrylic resin, or the like can be used as the material of the photosensitive resin layer.

To give further description, first, a photosensitive resin layer 22b is formed on the first surface S1 where the first cavity C1 of the metal plate 10 has been formed, as shown in FIG. 10. Next, after the photosensitive resin layer 22b is exposed to light and developed through a photomask (not shown), the photosensitive resin layer 22b patterned thus is cured by heat treatment.

Thus, a resin layer 22 having the same pattern as the aforementioned pattern in FIG. 9A is formed, as shown in FIG. 11. When a negative type photosensitive resin layer 22b is used, patterning is performed such that a portion exposed to light is crosslinked to be left and a portion unexposed to the light is removed by a developing solution. Alternatively, when a positive type photosensitive resin layer 22b is used, a portion exposed to light is removed by a developing solution, and a portion unexposed to the light is left as a pattern.

Incidentally, the technique of forming and patterning the resin layer 22 by the squeegee 24 through the screen mask 20 can attain cost reduction in comparison with the photolithography using the photosensitive resin layer and a light exposing device.

Figure 12A:
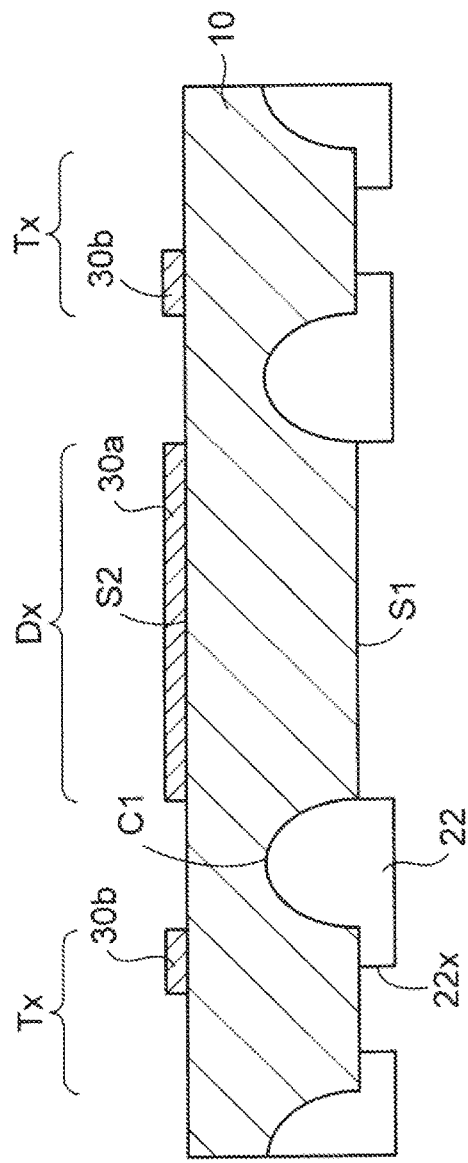
FIG. 12A is a sectional view showing the lead frame manufacturing method according to the first embodiment (Part 12)

Next, as shown in FIG. 12A, the aforementioned metal plate 10 in FIG. 9A is inverted vertically, and a first metal plating layer 30a and second metal plating layers 30b are formed and patterned on the second surface S2 of the metal plate 10.

Figure 12B:
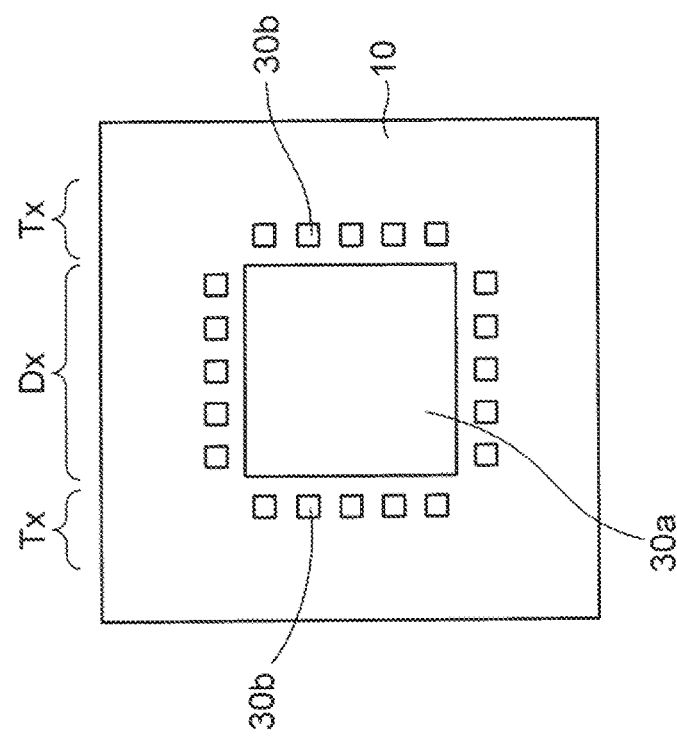
FIG. 12B is a plan view showing the lead frame manufacturing method according to the first embodiment (Part 12)

Refer to a reduced plan view of FIG. 12B in addition to FIG. 12A. The first metal plating layer 30a is disposed on a region of the second surface S2 corresponding to the die pad region Dx of the first surface S1 of the metal plate 10. In addition, the second metal plating layers 30b are disposed on inner side portions of regions of the second surface S2 corresponding to the lead terminal regions Tx of the first surface S1 of the metal plate 10.

As a method for forming the first and second metal plating layers 30a and 30b, first, a plating resist layer (not shown) provided with opening portions is formed on the second surface S2 of the metal plate 10. Further, the first and second metal plating layers 30a and 30b are formed by electrolytic plating using the metal plate 10 as a plating power feed route. Then, the plating resist layer is removed.

As the first and second metal plating layers 30a and 30b, a single layer film consisting of a silver (Ag) layer, or a multilayered film consisting of a nickel (Ni) layer/a palladium (Pd) layer/a gold (Au) layer in the named order from the bottom to the top can be used.

Incidentally, in FIG. 12A, metal plating layers may be formed on front surfaces of the lead terminal regions Tx exposed from the opening portions 22x of the resin layer 22. Thus, when solder balls are mounted on the lead terminals exposed from the opening portions 22x of the resin layer 22, the bonding property of the solder balls can be improved.

Figure 13A:
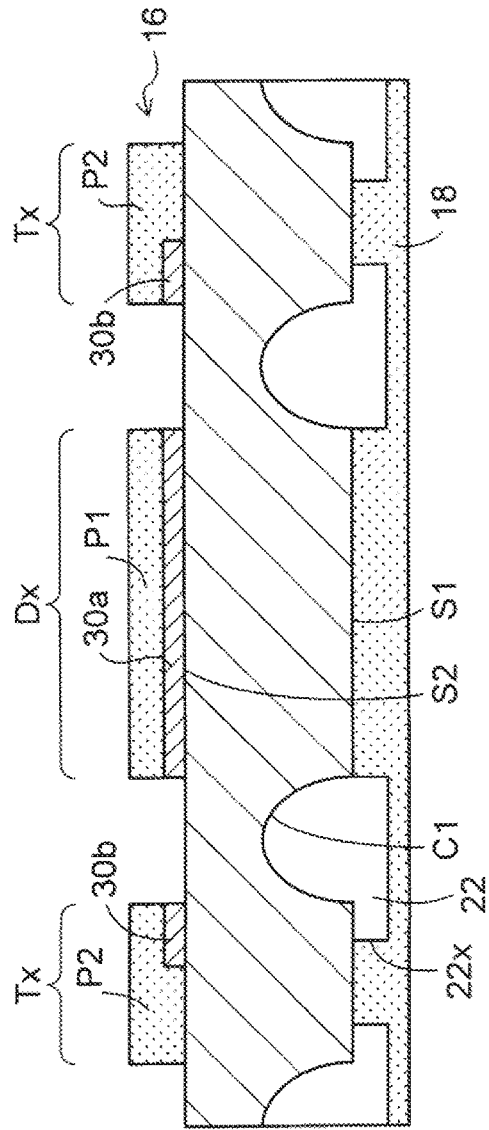
FIG. 13A is a sectional view showing the lead frame manufacturing method according to the first embodiment (Part 13)
Figure 13B:
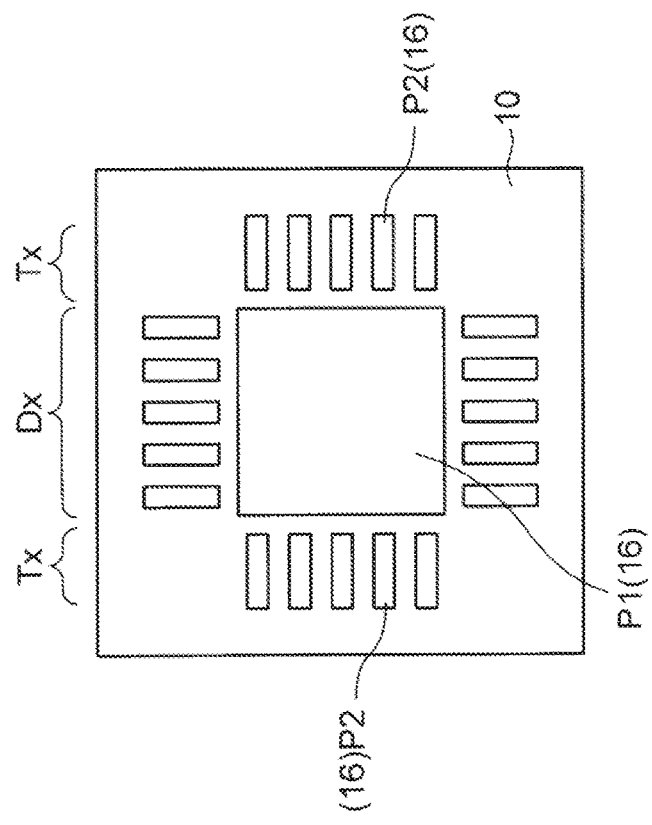
FIG. 13B is a plan view showing the lead frame manufacturing method according to the first embodiment (Part 13)

Successively, as shown in FIG. 13A, a third resist layer 16 is formed and patterned on the second surface S2 of the metal plate 10. The third resist layer 16 is formed to include a first pattern P1 corresponding to the die pad region Dx, and second patterns P2 corresponding to the lead terminal regions Tx. The third resist layer 16 is formed with the same pattern as that of the aforementioned first resist layer 12 in FIG. 2.

Refer to a reduced plan view of FIG. 13A additionally. The first pattern P1 of the third resist layer 16 is formed with the same pattern as that of the first metal plating layer 30a disposed on the region corresponding to the die pad region Dx.

On the other hand, the second patterns P2 of the third resist layer 16 covers the second metal plating layers 30b and is disposed to extend outward from the second metal plating layers 30b.

Further, a fourth resist layer 18 is formed on the entire first surface S1 of the metal plate 10.

Figure 14:
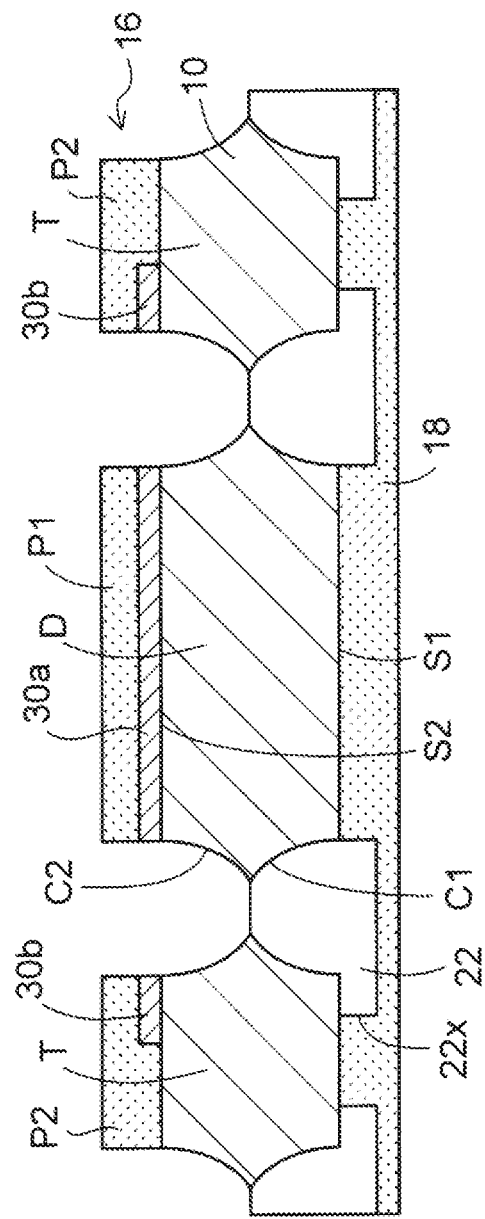
FIG. 14 is a sectional view showing the lead frame manufacturing method according to the first embodiment (Part 14)

Successively, as shown in FIG. 14, the metal plate 10 is wet-etched in the thickness direction from the second surface S2 through an opening region of the third resist layer 16.

On this occasion, the etching is performed until the second surface S2 (the etching surface) of the metal plate 10 reaches the resin layer 22 inside the first cavity C1. An etching portion of the metal plate 10 from the second surface S2 serves as a second cavity C2. The second cavity C2 is formed with the same pattern as that of the first cavity C1 in plan view.

In this manner, the second cavity C2 formed from the second surface S2 side of the metal plate 10 touches the first cavity C1 formed from the first surface S1 side of the metal plate 10. As a result, the metal plate 10 is penetrated in the thickness direction. Thus, a die pad D is obtained from the die pad region Dx and lead terminals T are obtained from the lead terminal regions Tx.

Then, as shown in FIG. 15, the third resist layer 16 and the fourth resist layer 18 are removed. In FIG. 15, support bars for supporting the die pad D and sawing bars for supporting the lead terminals T are not provided. However, the die pad and the lead terminals T are fixed by the resin layer 22. Accordingly, even when the metal plate 10 is penetrated, the die pad D and the lead terminals T in the metal plate 10 are not separated into pieces.

Further, since the die pad D and the lead terminals T are fixed by the resin layer 22, the lead frame can be prevented from being deformed.

Incidentally, in the aforementioned embodiment, the second cavity C2 is formed after the first and second metal plating layers 30a and 30b are formed on the second surface S2 of the metal plate 10.

Reversely to the aforementioned sequence, the first and second metal plating layers 30a and 30b may be formed after the second cavity C2 is formed in the second surface S2 of the metal plate 10.

In this case, the metal plate 10 for manufacturing the aforementioned lead frame according to the modification in FIG. 6 is used, and the sawing bars and the support bars coupled to the die pad D and the lead terminals T are formed. The first and second metal plating layers 30a and 30b are formed by electrolytic plating using the sawing bars and the support bars as plating power feed routes.

In the aforementioned manner, a lead frame 1 according to the first embodiment is obtained, as shown in FIG. 15. In description of the lead frame 1 in the first surface S1 is described as the lower surface and the second surface S2 is described as the upper surface.

FIG. 16 is a plan view of the lead frame 1 in FIG. 15 when seen from the upper surface side. FIG. 15 corresponds to a section taken along a line X3-X3 of the plan view of FIG. 16. In addition, FIG. 17 is a plan view of the lead frame 1 in FIG. 15 when seen from the lower surface side.

As shown in FIG. 15 and FIG. 16, the product regions R in the lead frame 1 according to the first embodiment are defined in an internal region of an outer frame (not shown). The die pad D is disposed in a central portion of each of the product regions R. The die pad D includes the first metal plating layer 30a in its upper surface.

Further, the lead terminals T are disposed around the die pad D of each of the product regions R. In the example of FIG. 16, five lead terminals T are disposed on an external region on each of four sides of the die pad D. Each of the lead terminals T extends outward from the circumference of the die pad D. The lead terminal T includes the second metal plating layer 30b in its upper surface. The second metal plating layer 30b is disposed on an inner side end portion of the lead terminal T on the die pad D side.

The first cavity C1 formed from the lower surface side of the metal plate 10 and the second cavity C2 formed from the upper surface side of the metal plate 10 communicate with each other, so that the die pad D and the lead terminals T are defined in the metal plate 10.

Thus, a protrusion PX protruding outward is formed in the height-wise middle of each of side surfaces of the die pad D and the lead terminals T. The protrusion PX is disposed in each portion where an inner surface of the semicircular first cavity C1 and an inner surface of the semicircular second cavity C2 communicate each other.

As will be described later, an electronic component is mounted on the first metal plating layer 30a of the die pad D, and the electronic component is connected to the second metal plating layers 30b of the lead terminals T by metal wires.

In addition, as shown in FIG. 15 and FIG. 17, the resin layer 22 is fully filled in the first cavity C1 around the lower surface of the die pad D. The resin layer 22 is formed in the first cavity C1 at a lower side region of the protrusion PX on each of the side surfaces of the die pad D and the lead terminals T. In addition, the resin layer 22 protrudes downward from the position of the lower surface of the die pad D.

Thus, the die pad and the lead terminals T are fixed by the resin layer 22. In addition, the resin layer 22 extends from the inside of the first cavity C1 to the lower surfaces of the lead terminals T. The opening portions 22x of the resin layer 22 are disposed on the connection portions of the lower surfaces of the lead terminals T.

The lead terminals T are covered with the resin layer 22. One portions of the lead terminals T are exposed from the opening portions 22x of the resin layer 22. In addition, the die pad D is exposed from an opening portion of the resin layer 22.

Thus, the resin layer 22 is formed to extend from the side surfaces of the lead terminals T to the lower surfaces of the lead terminals T, and the opening portions of the resin layer 22 are disposed on the lower surfaces of the lead terminals T. The opening portions 22x of the resin layer 22 are disposed on the connection portions of the lead terminals T in order to position and mount electrically conductive balls such as solder balls.

As described in the aforementioned manufacturing method, after the first cavity C1 is formed in the lower surface of the metal plate 10 to thereby define the die pad region Dx and the lead terminal regions Tx, the resin layer 22 is formed on the first cavity C1 to thereby fix the metal plate 10.

The second cavity C2 is formed in the upper surface of the metal plate 10 so that the metal plate 10 is penetrated. As a result, the die pad D and the lead terminals T are obtained.

By using such a technique, the lead frame can be prevented from being deformed in the manufacturing process even when the metal plate 10 shaped like a thin plate is used. Thus, a QFN type lead frame with a thin p thickness can be manufactured reliably.

In addition, the resin layer 22 is formed on the region around the lower surface of the die pad D to cover the lower surfaces of the lead terminals T, and the opening portions 22x of the resin layer 22 are disposed on the connection portions of the lower surfaces of the lead terminals T. Thus, electrically conductive balls such as solder balls can be positioned and mounted on the opening portions 22x of the resin layer 22 on the lower surfaces of the lead terminals T. Accordingly, the electrically conductive balls can be connected to the lead terminals T reliably.

Further, as described in the aforementioned manufacturing method, the resin layer 22 is formed on the first cavity C1 formed in the lower surface of the metal plate 10 to thereby fix the metal plate 10. Accordingly, the support bars or the sawing bars can be omitted.

Thus, the region where the product patterns of the lead terminals etc. can be disposed can increase. Accordingly, the degree of freedom for design of the lead frame can be enhanced.

In addition, due to the omission of the sawing bars, the sawing bars may not be cut to separate the lead terminals T from one another. Thus, burs can be suppressed from being generated at the cut portions, and the life of the cutting blade of the cutting device can be elongated. As a result, cost can be reduced.

Figure 18:
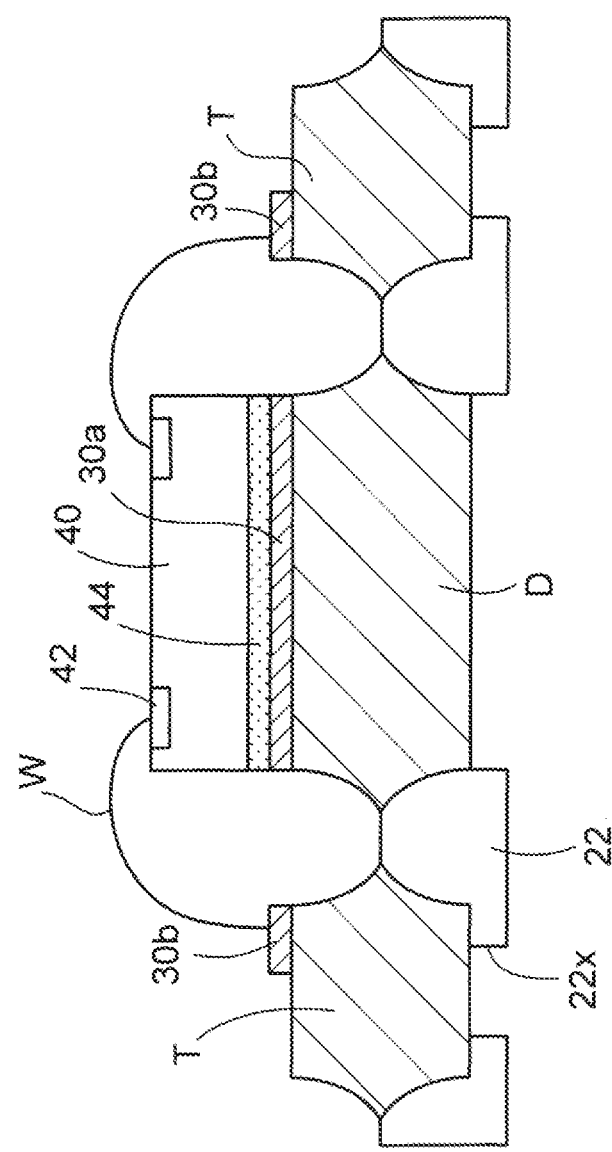
FIG. 18 is a sectional view showing an electronic component device manufacturing method according to the first embodiment (Part 1)

Next, an electronic component device manufacturing method using the lead frame 1 in FIG. 15 will be described. As shown in FIG. 18, semiconductor chips 40 each of which includes connection terminals 42 provided in its upper surface are prepared.

Back surfaces of the semiconductor chips 40 are adhesively bonded and mounted onto the first metal plating layers 30a of the die pads D of the lead frame 1 by an adhesive agent 44. Each of the semiconductor chips 40 is an example of an electronic component. Various electronic components can be used alternatively.

Further, the connection terminals 42 of the semiconductor chips 40 are connected to the second metal plating layers 30b of the lead terminals T of the lead frame 1 by metal wires W by a wire bonding method.

Normally, the wire bonding is performed in a state in which the lead frame has been fixed by a pressing jig for each product region. However, when the product regions of the lead frame are small in area and defined at high density, it is difficult to fix the lead frame by the presser jig for each product region.

Therefore, in the product regions of the metal plate that have not been securely fixed, the lead terminals vibrate in the lateral direction when the wire bonding is performed. Consequently, the metal wires cannot be bonded onto the lead terminals reliably.

In the embodiment, the lead terminals T of the lead frame 1 are fixed by the resin layers 22. Accordingly, even in the product regions that have not been securely fixed by the pressing jig, vibration of the lead terminals T can be suppressed. Consequently, the wire bonding can be performed stably.

Figure 19:
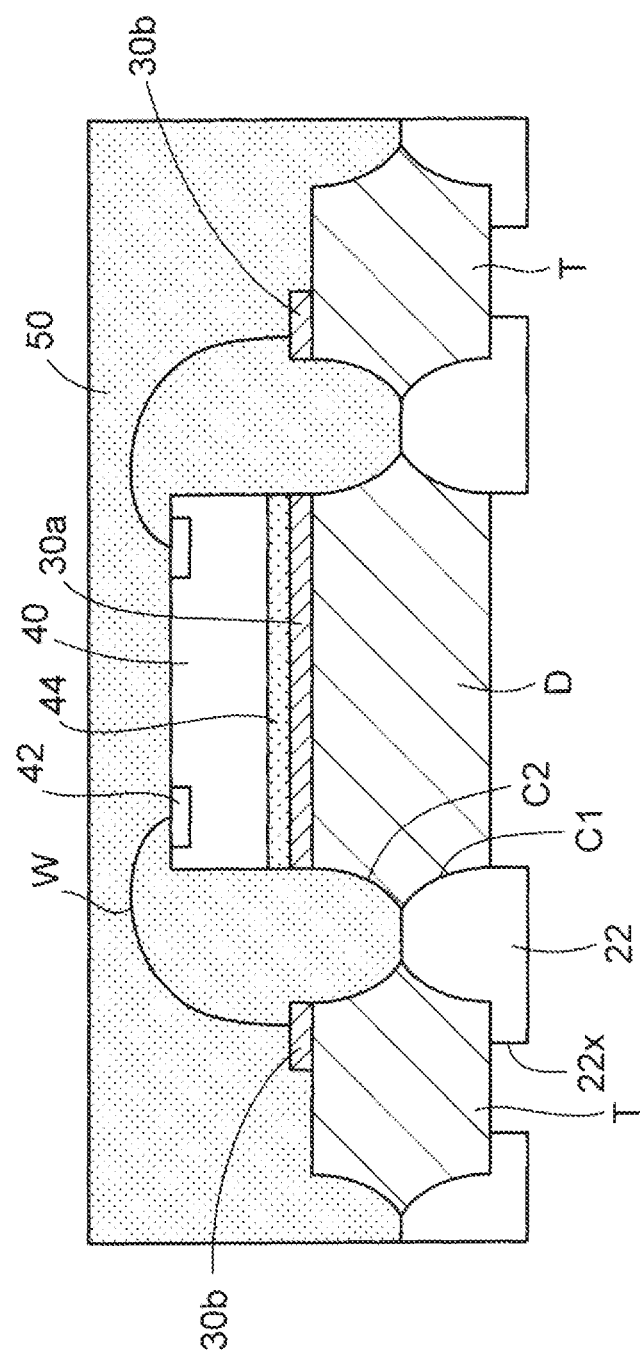
FIG. 19 is a sectional view showing the electronic component device manufacturing method according to the first embodiment (Part 2)

Next, as shown in FIG. 19, the lead frame 1, the semiconductor chips 40, and the metal wires W are sealed with a sealing resin (encapsulation resin) 50 such as an epoxy resin. The sealing resin 50 is formed on the upper surface side of the lead frame 1.

In the manufacturing method of the general QFN type lead frame, the wire bonding step or the step of forming the sealing resin 50 is performed in a state in which a mold tape has been pasted on the lower surface of the lead frame in order to prevent the resin from leaking from the opening portions of the lead frame.

In the embodiment, the first cavities C1 on the lower surface side of the lead frame 1 are filled with the resin layers 22 so that the opening portions are sealed therewith. Therefore, assembling work can be performed easily without the necessity of pasting the mold tape.

Figure 20:
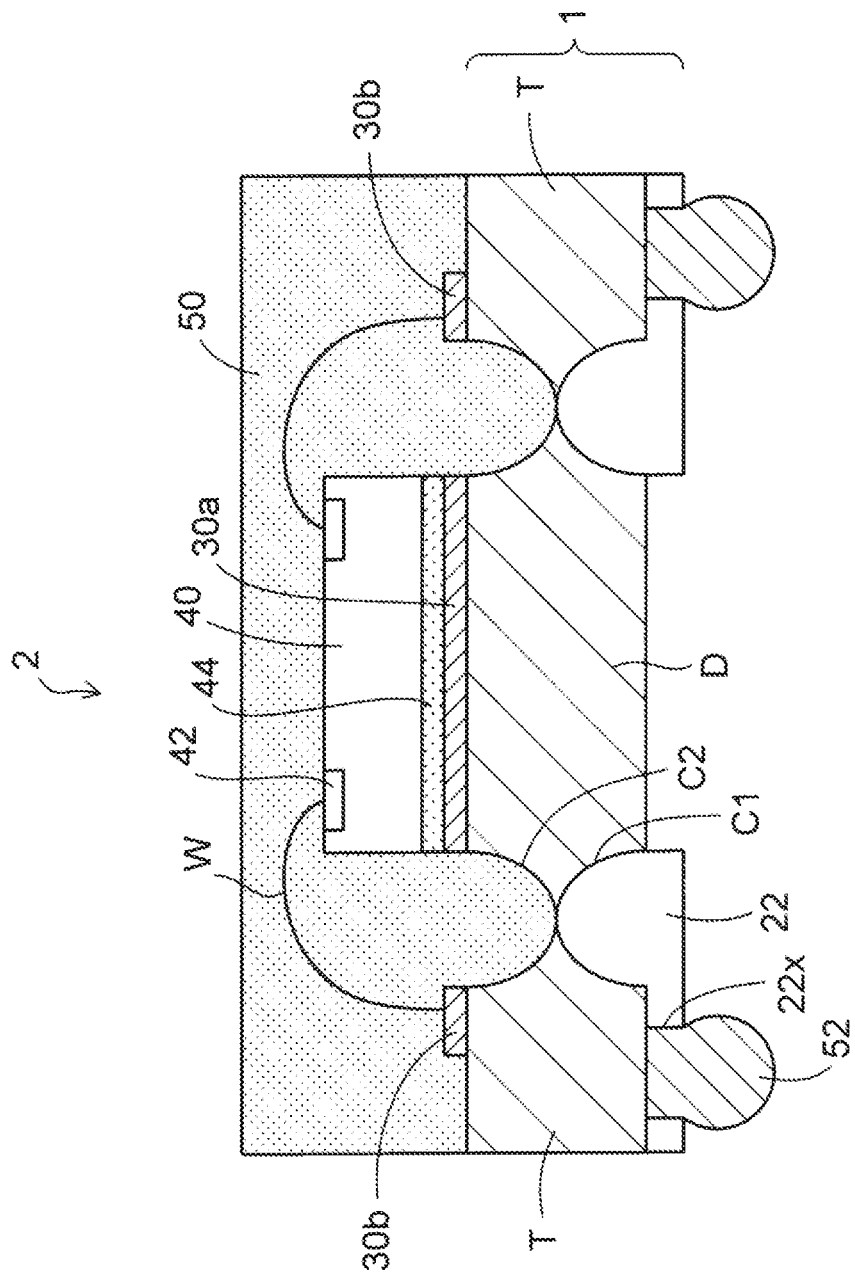
FIG. 20 is a sectional view showing an electronic component device according to the first embodiment.

As shown in FIG. 20, the sealing resin 50, the lead terminals T and the resin layer 22 are cut in the thickness direction for each product region R. Further, solder balls 52 are mounted on the connection portions of the lead terminals T inside the opening portions 22x of the resin layer 22. Thus, each of individual electronic component devices 2 is obtained.

The solder balls 52 may be mounted before the structure body in FIG. 19 is cut. Alternatively, the solder balls 52 may be mounted before the semiconductor chips 40 are mounted on the lead frame 1 in FIG. 15. Each of the solder balls 52 is an example of an electrically conductive ball. Any other metal ball may be used alternatively.

In the aforementioned manner, each of the electronic component devices 2 according to the first embodiment is manufactured, as shown in FIG. 20. In the electronic component device 2 according to the first embodiment, even the lead frame shaped like a thin plate can be prevented from being deformed, as described above. Accordingly, the thin electronic component device can be made reliably. In addition, since the sawing bars or the support bars can be omitted from the lead frame, the degree of freedom for design can be enhanced.

In addition, the opening portions 22x of the resin layer 22 for mounting the solder balls 52 are disposed on the lower surfaces of the lead terminals T. Thus, the solder balls 52 that have been positioned at the opening portions 22x of the resin layer 22 can be reliably connected to the connection portions of the lead terminals T.

Further, the resin layer 22 is formed out of a photosensitive resin. Accordingly, the thickness of the resin layer 22 can be adjusted easily. Thus, the height of each of the opening portions 22x of the resin layer 22 can be adjusted most suitably in consideration of the size of each of the solder balls. Accordingly, connection with various mount boards using the solder balls can be performed reliably.

Figure 32:
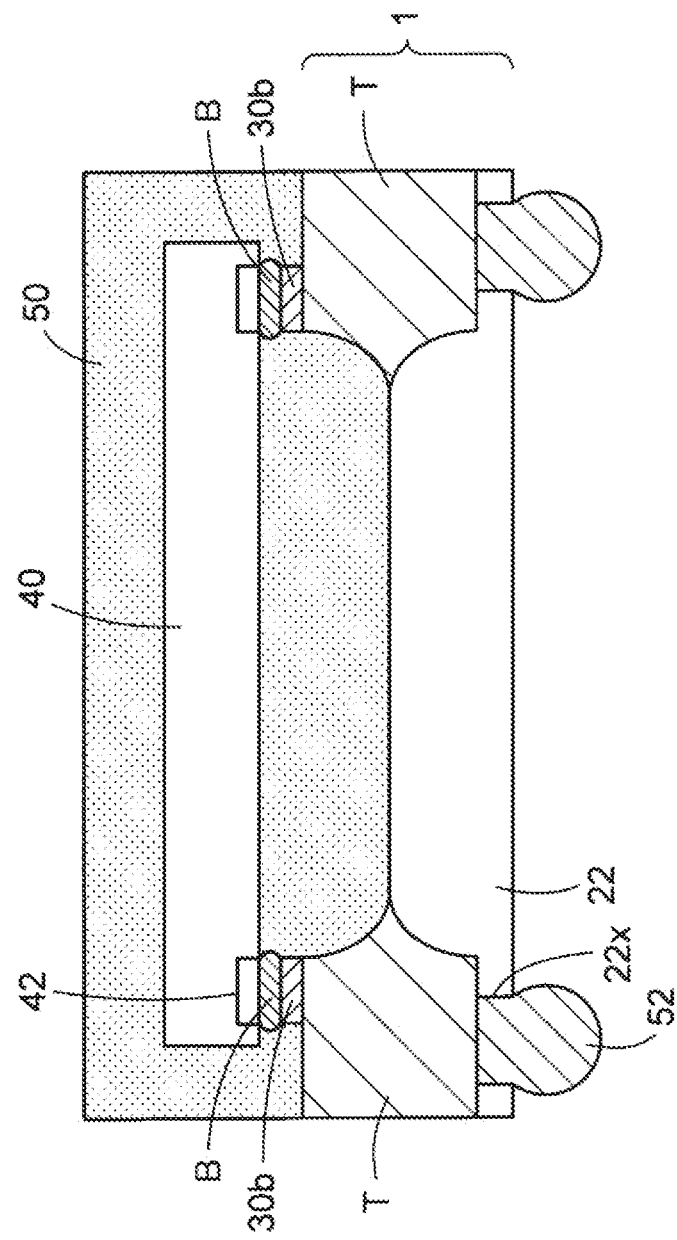
FIG. 32 is a sectional view showing an electronic component device where a semiconductor chip is electrically connected to second metal plating layers via bumps by flip-chip bonding.

Incidentally, in the embodiment, the semiconductor chip 40 is electrically connected to the second metal plating layers 30b by wiring bonding using the metal wires W. However, the embodiment is not limited thereto. For example, as shown in FIG. 32, the semiconductor chip 40 may be electrically connected to the second metal plating layers 30b via bumps B by flip-chip bonding. In this example, a die pad is omitted in the lead frame.

Figure 21:
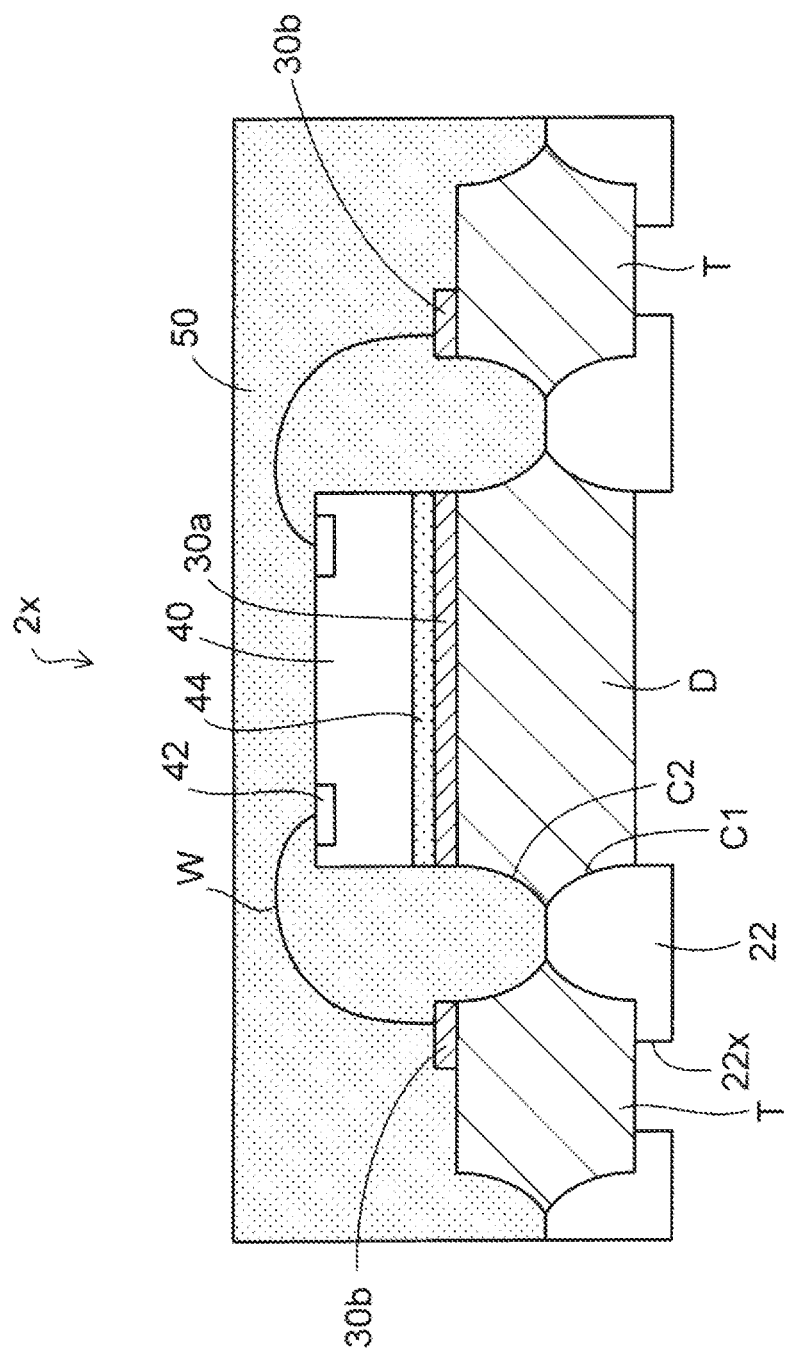
FIG. 21 is a sectional view showing another electronic component device according to the first embodiment.

FIG. 21 shows another electronic component device 2x according to the first embodiment. As shown in FIG. 21, the other electronic component device 2x is obtained by cutting a portion (a portion outside the lead terminals T) where only the sealing resin 50 and the resin layer 22 in the aforementioned structure body in FIG. 19 have been disposed on each other.

In the electronic component device 2x, cutting of the lead terminals is unnecessary. Accordingly, burrs can be prevented from being generated due to the cutting of the lead terminals T. In addition, since the cutting of the lead terminals T made of harder metal than a resin is unnecessary, the life of a cutting blade can be elongated.

Further, the side surfaces of the lead terminals T are entirely covered with the sealing resin 50 and the resin layer 22. Accordingly, moisture can be prevented from entering the inside of the electronic component device from an interface between the sealing resin 50 and the resin layer 22. Thus, the reliability of the electronic component device can be improved.

Second Embodiment

Figure 26:
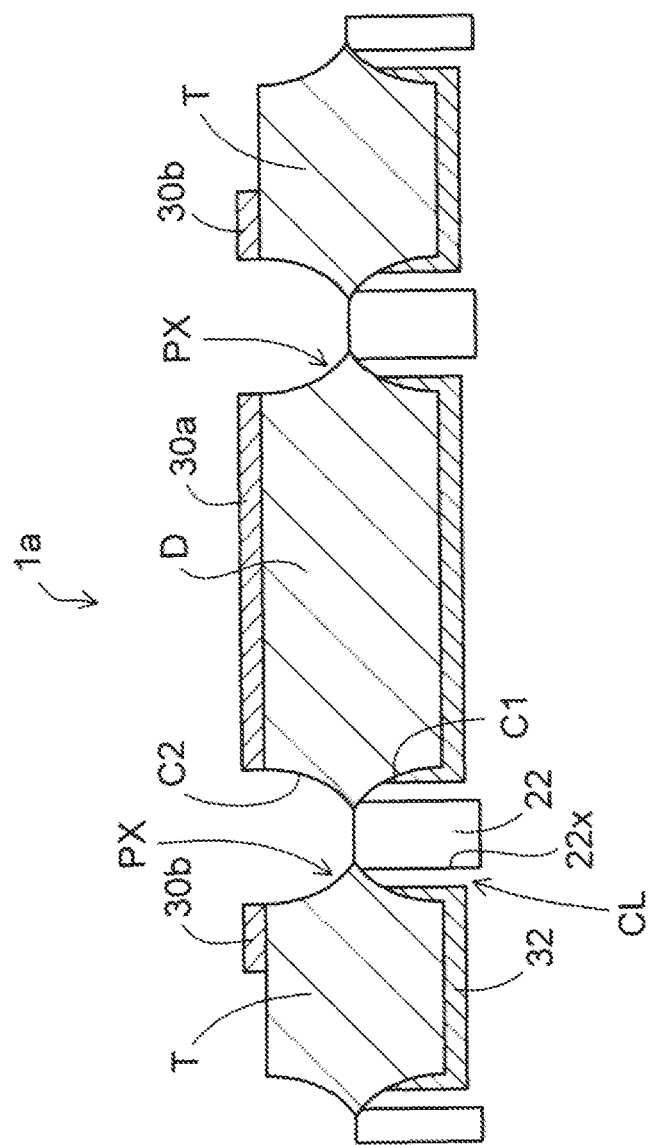
FIG. 26 is a sectional view showing a lead frame according to the second embodiment.
Figure 27:
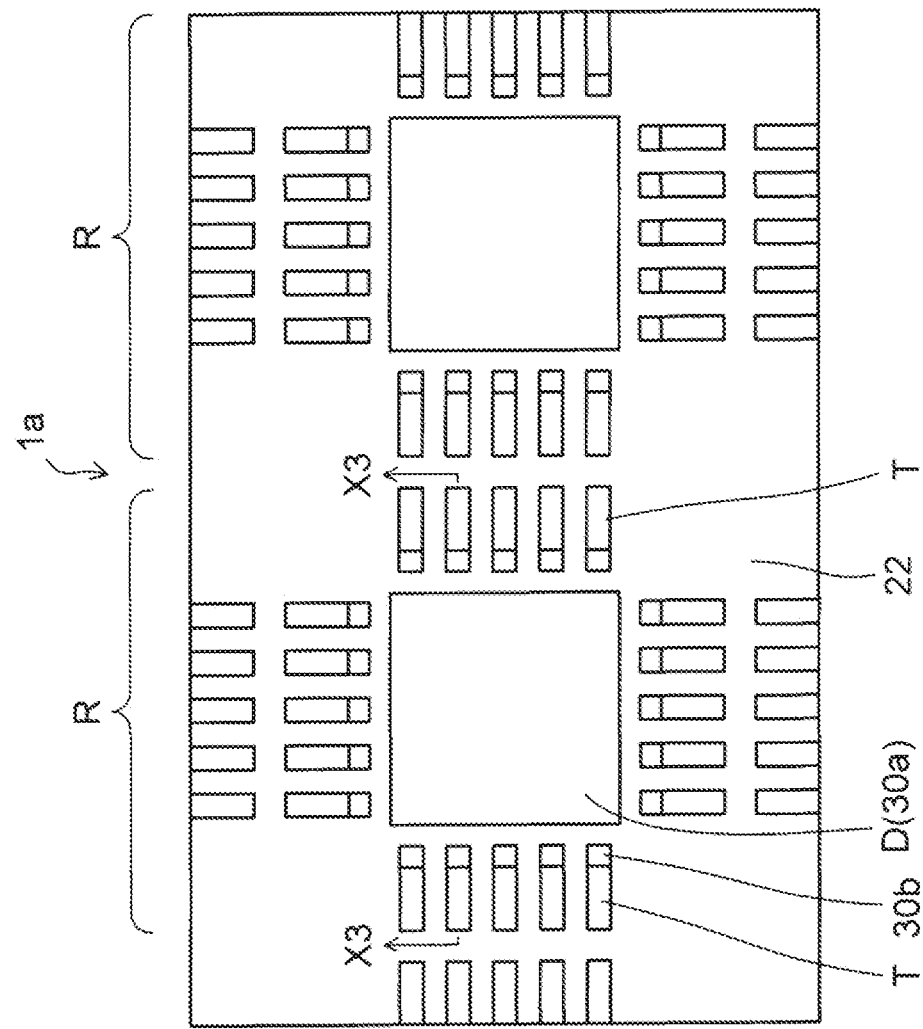
FIG. 27 is a plan view of the lead frame in FIG. 26 when seen from an upper surface side.
Figure 28:
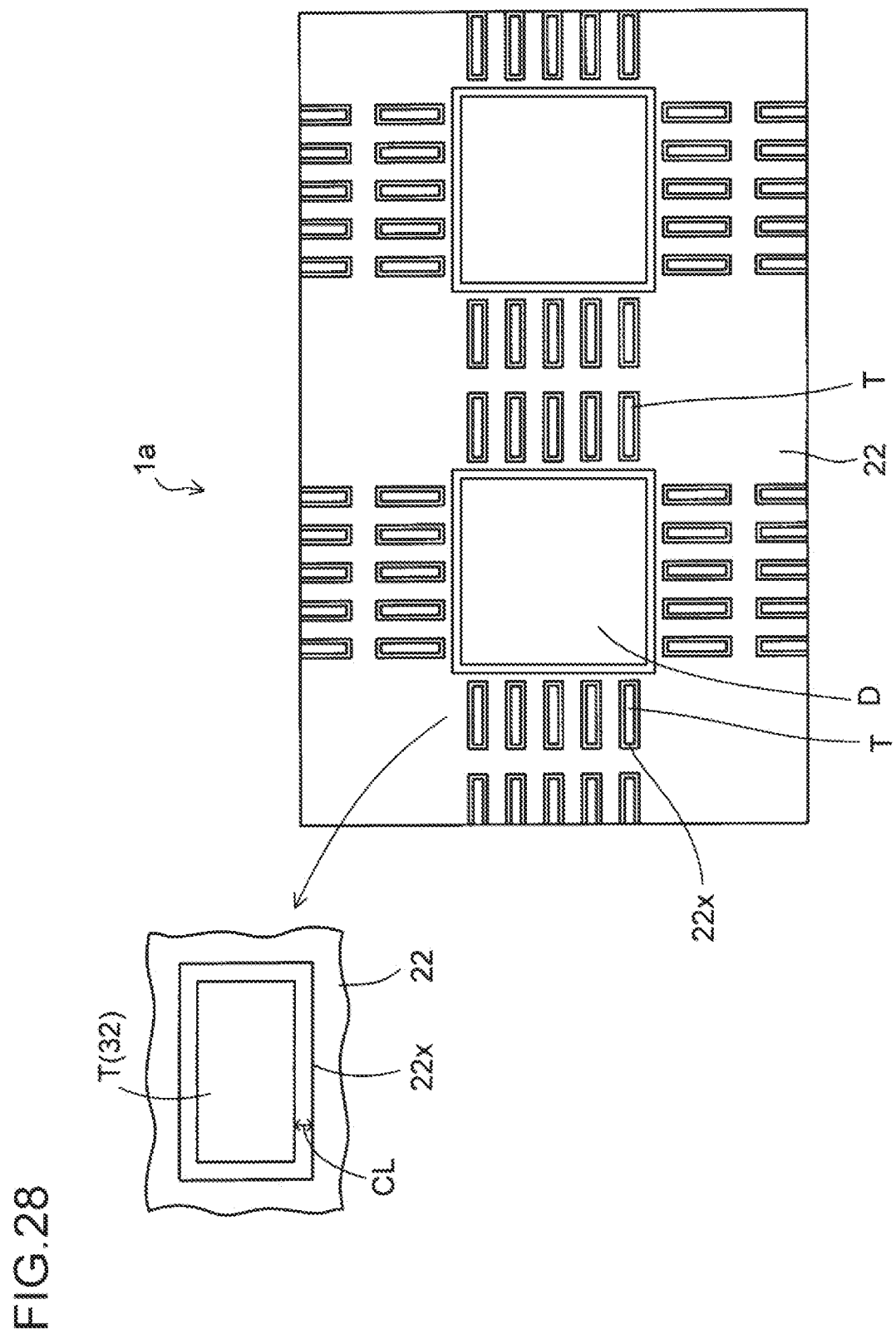
FIG. 28 is a plan view of the lead frame in FIG. 26 when seen from a lower surface side.
Figure 29:
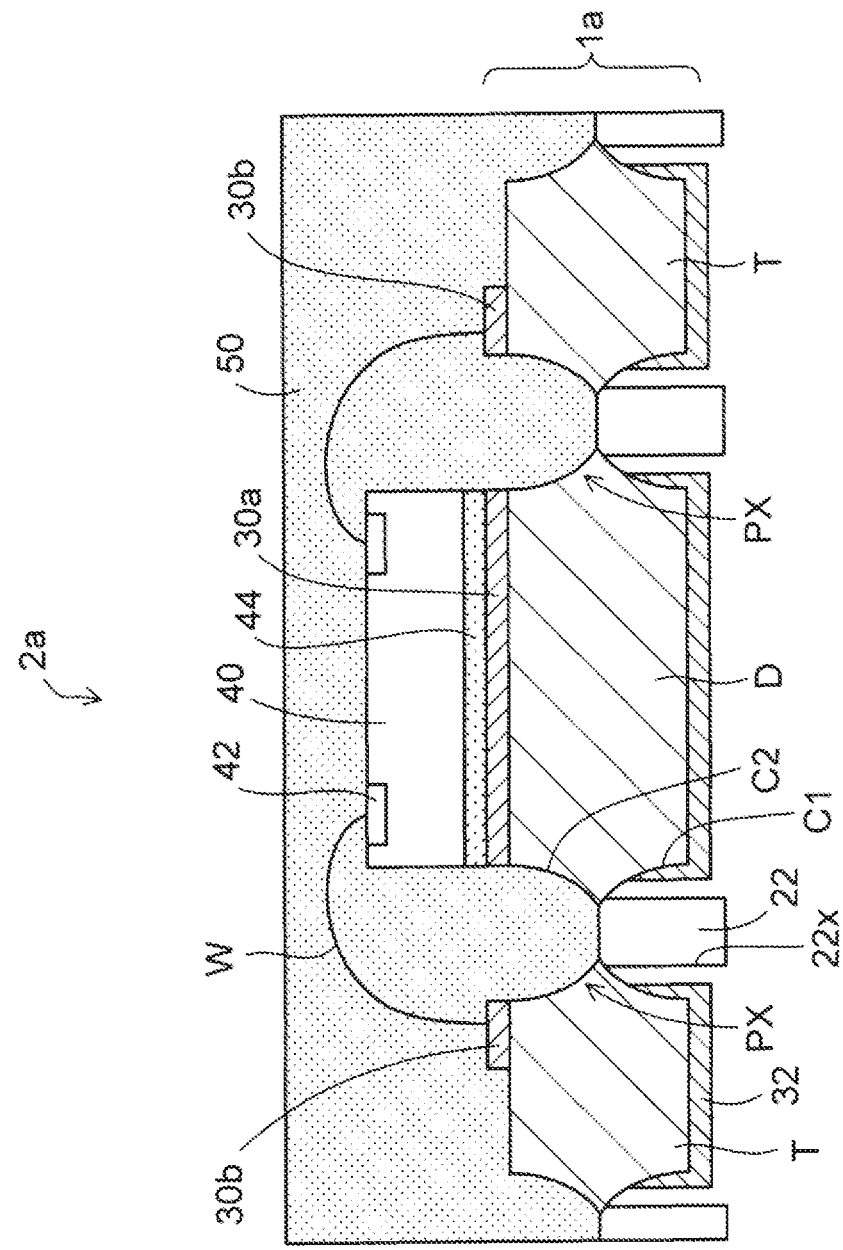
FIG. 29 is a sectional view showing an electronic component device according to the second embodiment.

FIGS. 22 to 25 are views showing a lead frame manufacturing method according to a second embodiment. FIGS. 26 to 28 are views showing a lead frame according to the second embodiment. FIG. 29 is a view showing an electronic component device according to the second embodiment.

In the lead frame according to the second embodiment, opening portions of resin layers are disposed on the circumferences separated from side surfaces of lead terminals, and solder layers are formed to extend from lower surfaces of the lead terminals to the side surfaces of the lead terminals. In the second embodiment, detailed description about the same steps and the same constituent members as those in the first embodiment will be omitted.

Figure 22:
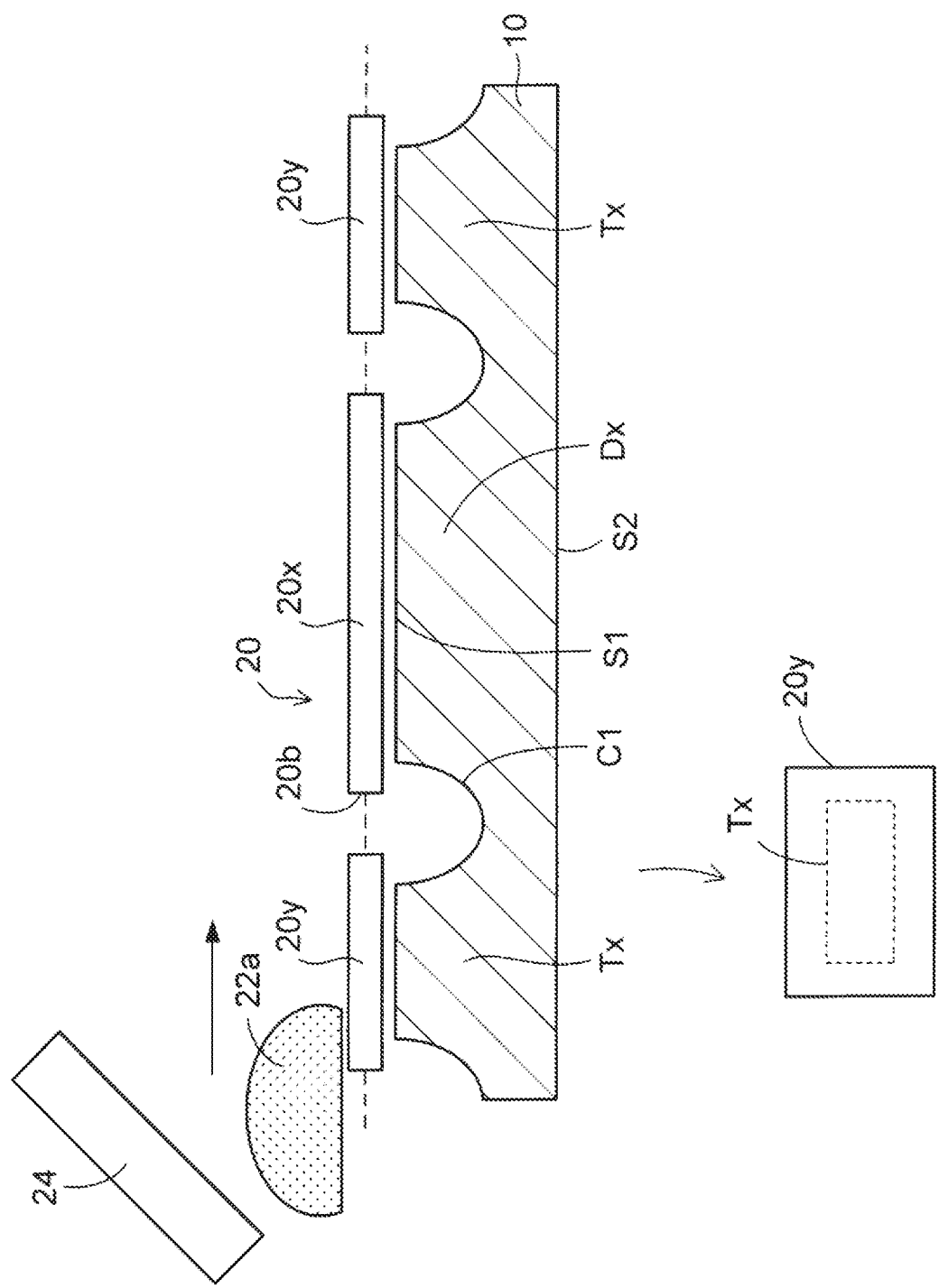
FIG. 22 is a sectional view and a plan view showing a lead frame manufacturing method according to a second embodiment (Part 1)

In the lead frame manufacturing method according to the second embodiment, screen masks 20 are disposed on a first surface S1 of a metal plate 10 where first cavities C1 have been formed in the same manner as in the aforementioned step of FIGS. 7A and 7B according to the first embodiment, as shown in FIG. 22.

In the second embodiment, a first emulsion layer 20x of each of the screen masks 20 is disposed on a portion corresponding to the aforementioned die pad region Dx of FIG. 5 in the same manner as that in the first embodiment. The planar size of the first emulsion layer 20x is larger than that of the die pad region Dx. On the other hand, each of second emulsion layers 20y of the screen mask 20 is disposed on a corresponding one of lead terminal regions Tx to be one planar size larger than a planar size of the lead terminal region Tx.

As shown in a partial plan view of FIG. 22, a ring-like circumferential edge portion of the second emulsion layer 20y is disposed to stick out of an outer circumference of the lead terminal region Tx.

Further, in the same manner as FIG. 7A according to the aforementioned first embodiment, a liquid or paste-like resin material 22a is disposed on the screen mask 20. The resin material 22a is moved laterally by a squeegee 24.

Figure 23:
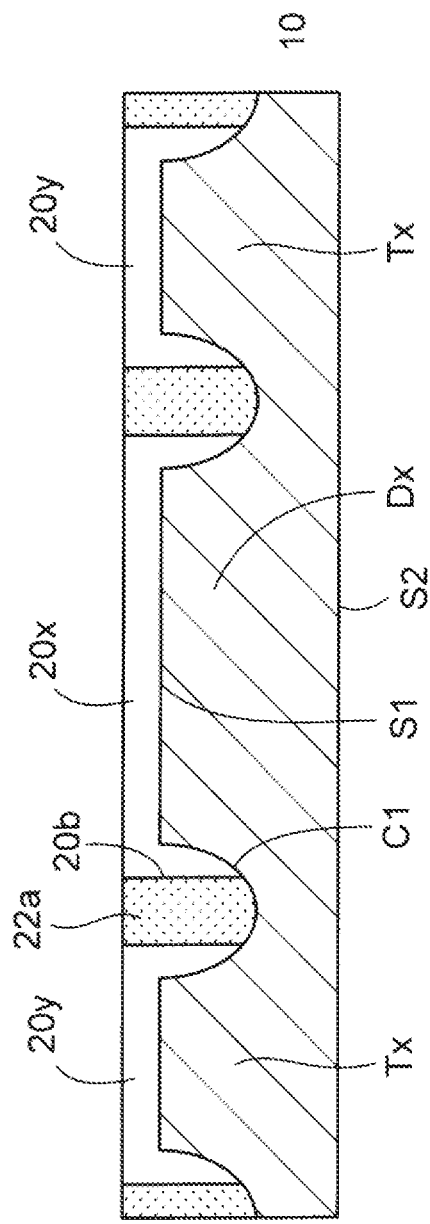
FIG. 23 is a sectional view showing the lead frame manufacturing method according to the second embodiment (Part 2)

Thus, as shown in FIG. 23, the resin material 22a is disposed to be extruded downward from an opening portion 20b of a mesh 20a where the first and second emulsion layers 20x and 20y have not been disposed. On the other hand, the resin material 22a is not formed in regions where the first and second emulsion layers 20x and 20y have been disposed.

On this occasion, the second emulsion layers 20y have flexibility. Accordingly, when the second emulsion layers 20y are pressed by the squeegee 24 to abut against lead terminal regions Tx of the metal plate 10, the circumferential edge portions of the second emulsion layers 20y cover and protect side surfaces of the lead terminal regions Tx. In this state, the first cavity C1 is filled with the resin material 22a. Accordingly, the resin material 22a is not formed on the side surfaces of the lead terminal regions Tx.

Figure 24:
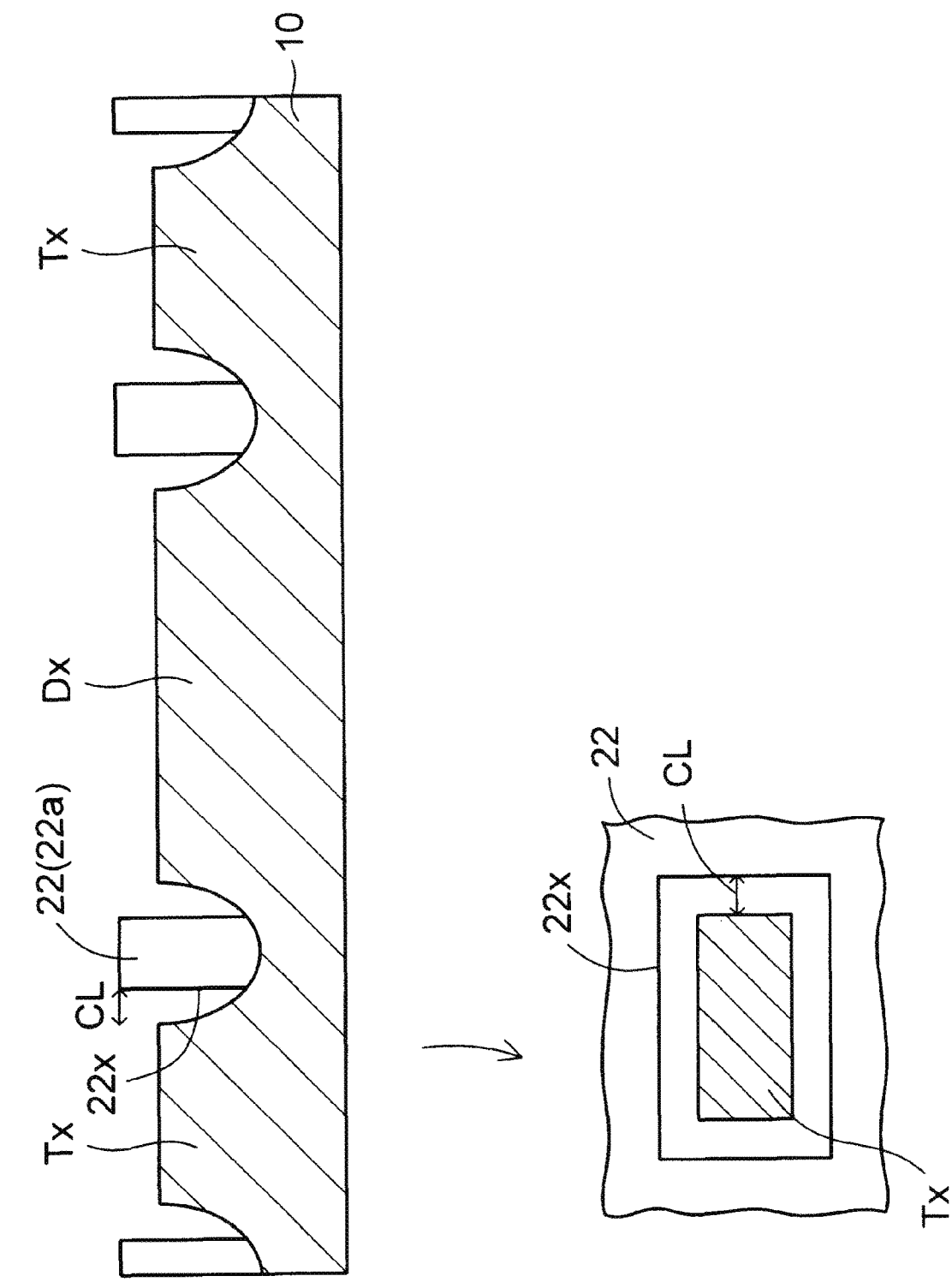
FIG. 24 is a sectional view and a plan view showing the lead frame manufacturing method according to the second embodiment (Part 3)

Therefore, as shown in FIG. 24, when the screen mask 20 is removed from the metal plate 10 in FIG. 23, a clearance CL is provided between the side surfaces of the lead terminal regions Tx and side walls of the resin material 22a. Further, the resin material 22a is cured by heat treatment. As a result, a resin layer 22 is obtained.

As shown in a partial plan view of FIG. 24, each of opening portions 22x of the resin layer 22 one planar size larger than a corresponding one of the lead terminal regions Tx is disposed around the lead terminal region Tx. The lead terminal region Tx is shaped like a rectangle in plan view. Thus, the ring-like clearance CL is disposed between the side surfaces of the lead terminal regions Tx and the side walls of the resin material 22a. Also, the ring-like clearance CL is disposed between the side surfaces of the die pad region Dx and the side walls of the resin materials 22a.

The width of the clearance CL is set, for example, at about 20 μm to about 30 μm. The size or thickness of each of the second emulsion layers 20y of the screen mask 20 and sliding conditions performed by the squeegee 24 are adjusted so that the clearance CL having a desired width can be obtained.

The resin layer 22 having the same pattern as that in FIG. 24 may be formed of a photosensitive resin layer patterned by photolitohphy as described above in FIGS. 10 and 11 according to the first embodiment.

Figure 25:
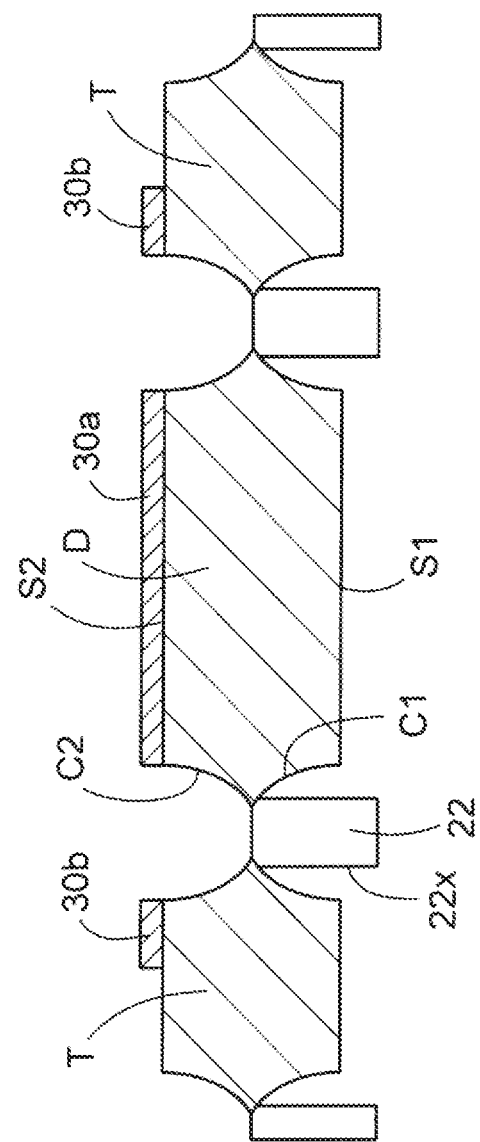
FIG. 25 is a sectional view showing the lead frame manufacturing method according to the second embodiment (Part 4)

Next, the same steps as those in FIGS. 12A to 15 in the aforementioned first embodiment are performed so that the metal plate 10 is penetrated to thereby obtain a die pad D and lead terminals T, as shown in FIG. 25. The die pad D includes a first metal plating layer 30a provided on an upper surface of the die pad D. In addition, each of the lead terminals T includes a second metal plating layer 30b provided on an inner-side end portion of an upper surface of the lead terminal T on the die pad D side.

Further, as shown in FIG. 26, a solder layer 32 is formed to extend from a lower surface (top surface) of each of the lead terminals T inside a corresponding one of the opening portions 22x of the resin layer 22 toward a side surface of the lead terminal T.

The solder layer 32 is, for example, 5 µm to 10 µm thick.

The solder layer 32 is formed as a coating of a solder paste. The solder layer 32 is an example of a metal bonding material. Any other electrically conductive paste than the solder layer 32, such as a silver paste, may be used.

Simultaneously, a solder layer 32 is formed to extend from a lower surface (top surface) of the die pad inside an opening portion of the resin layer 22 toward a side surface of the die pad D. When the lower surface of the die pad D is not used as a connection portion, the lower surface and the side surface of the die pad D may be covered with the resin layer 22.

Alternatively, the solder layers 32 may be formed by electrolytic plating. In this case, the metal plate 10 for manufacturing the aforementioned lead frame according to the modification in FIG. 6 is used, and sawing bars and support bars coupled to the die pad D and the lead terminals T are formed. Solder plating layers are formed by electrolytic plating using the sawing bars and the support bars as plating power feed routes.

In the aforementioned manner, a lead frame 1a according to the second embodiment is manufactured, as shown in FIG. 26. FIG. 27 is a plan view of the lead frame 1a in FIG. 26 when seen from an upper side. FIG. 28 is a plan view of the lead frame 1a in FIG. 26 when seen from a lower side.

As shown in FIG. 26 and the upper surface-side plan view of FIG. 27, the die pad D and the lead terminals T are fixed by the resin layer 22 in the lead frame 1a according to the second embodiment in the same manner as that in the lead frame 1 according to the first embodiment.

In the second embodiment, the planar size of each of the opening portions 22x of the resin layer 22 is set to be larger than the planar size of each of the lead terminals T, as shown in FIG. 26 and the lower surface-side plan view of FIG. 28. The clearance CL is provided between the side surface of the lead terminal T and the side wall of the opening portion 22x of the resin layer 22.

Thus, the opening portions 22x of the resin layer 22 are disposed around lower portions of the lead terminals T. The surfaces and the side surfaces of the lead terminals T are exposed from the resin layer 22. The lead terminals T are surrounded by the side walls of the opening portions 22x of the resin layer 22 with the clearance CL interposed therebetween.

As shown in FIG. 26, a protrusion PX is formed in the height-wise middle of each of the side surfaces of the lead terminals T and the die pad D in the same manner as the lead frame 1 according to the first embodiment. The resin layer 22 is formed in the first cavity C1 in a lower side region of the protrusion PX.

In addition, the solder layer 32 is formed to extend from the lower surface of the lead terminal T inside the opening portion 22x of the resin layer 22 toward the side surface of the lead terminal T. The lead terminal T formed thus includes the solder layer 32 provided on its front surface.

In the example of FIG. 26 and the lower surface-side plan view of FIG. 28, the solder layer 32 is formed so that the clearance CL remains between the side surface of the lead terminal T and the side wall of the opening portion 22x of the resin layer 22. As another example, the clearance CL between the side surface of the lead terminal T and the side wall of the opening portion 22x of the resin layer 22 may be buried in the solder layer 32.

Successively, the same steps as the aforementioned steps of FIGS. 18, 19, and 21 in the first embodiment are performed so that an electronic component device 2a according to the second embodiment can be obtained, as shown in FIG. 29.

In the electronic component device 2a according to the second embodiment, the solder layers 32 are formed to extend from the lower surfaces of the lead terminals T to the side surfaces of the lead terminals T in the aforementioned manner.

Therefore, when the lead terminals T of the electronic component device 2a in FIG. 29 are connected to connection electrodes of a mount board such as a motherboard, the solder layers 32 are disposed so that foot parts thereof extend on the side surfaces of the lead terminals T respectively. Accordingly, due to an increase in each of bonding areas between the lead terminals T of the electronic component device 2a and the connection electrodes of the mount board through the solder layers 32, the reliability of electric connection can be improved.

In addition, the connection strength between the lead terminals of the electronic component device 2a and the connection electrodes of the mount board can be enhanced.

Third Embodiment

Figure 30:
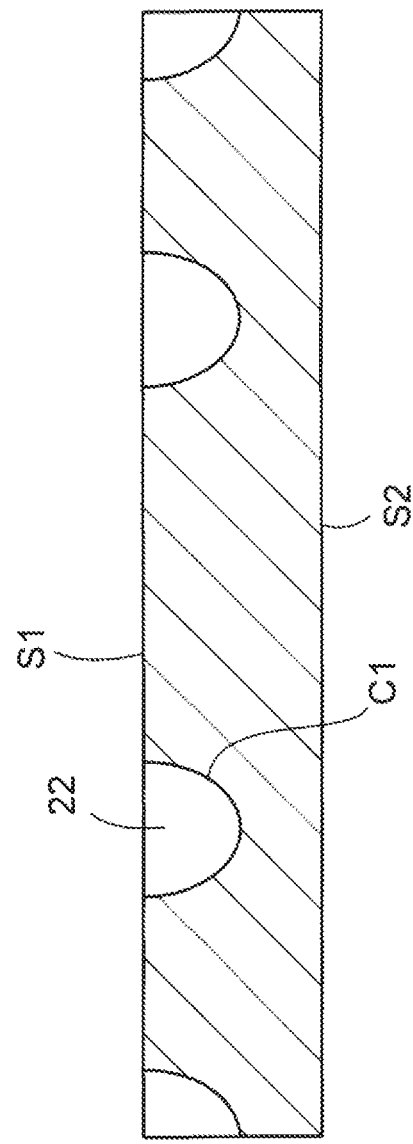
FIG. 30 is a sectional view showing a lead frame manufacturing method according to a third embodiment.
Figure 31:
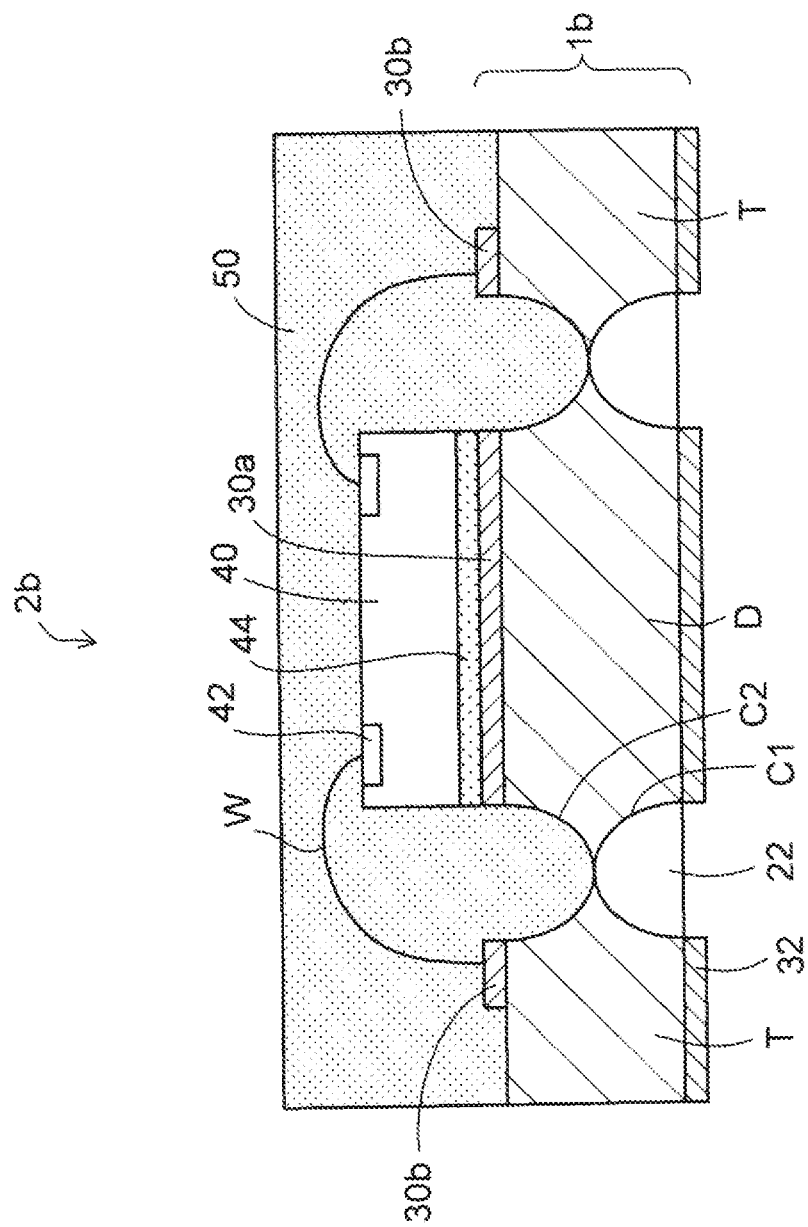
FIG. 31 is a sectional view showing an electronic component device according to the third embodiment.

FIG. 30 is a view for explaining a lead frame manufacturing method according to a third embodiment. FIG. 31 is a view showing an electronic component device according to the third embodiment. In the third embodiment, a resin layer is formed in only each first cavity of a lead frame. In the third embodiment, the detailed description about the same steps and the same constituent members as those in the first embodiment will be omitted.

In the lead frame manufacturing method according to the third embodiment, the resin layer 22 is filled in only the first cavity C1 of a metal plate 10 as shown in FIG. 30, in the aforementioned step of forming the resin layer 22 in FIGS. 7A to 9 according to the first embodiment.

As in the example of FIG. 30, an upper surface of the resin layer 22 and a first surface S1 of the metal plate 10 may be formed to be flush with each other. Alternatively, the upper surface of the resin layer 22 may slightly protrude from the first surface S1 of the metal plate 10.

The aforementioned second emulsion layers 20y of the screen mask 20 in FIG. 7A may be formed with the same patterns as lead terminal regions Tx so that a resin material 22a can be filled in the first cavity C1 by a squeegee 24 through the screen mask 20 in the same manner.

Alternatively, the resin layer 22 may be formed out of a photosensitive resin. In this case, a positive type photosensitive resin layer is formed on the first surface S1 of the metal plate 10 to be filled in the first cavity C1. The positive type photosensitive resin layer is entirely exposed to light and developed so that a portion of the positive type photosensitive resin layer inside the first cavity C1 serves as an unexposed portion to the light. Thus, the resin layer 22 is filled in only the first cavity C1 of the metal plate 10.

Next, the same steps as the aforementioned steps of FIGS. 12A to 20 in the first embodiment are performed so that the electronic component device 2b using the lead frame 1b according to the third embodiment can be obtained, as shown in FIG. 31. In the electronic component device 2b according to the third embodiment, solder layers 32 are formed one entire lower surfaces of lead terminals T and an entire lower surface of a die pad D that are exposed from the resin layer 22 of the lead frame 1b.

Also in the electronic component device 2b according to the third embodiment, the metal plate 10 is fixed by the resin layer 22 after the first cavity C1 is formed in the metal plate 10 shaped like a thin plate. Accordingly, the lead frame can be prevented from being deformed in the manufacturing process. In addition, sawing bars or support bars can be omitted. Accordingly, the degree of freedom for design can be enhanced.

As described above, the exemplary embodiment and the modification are described in detail. However, the present invention is not limited to the above-described embodiment and the modification, and various modifications and replacements are applied to the above-described embodiment and the modifications without departing from the scope of claims.

Various aspects of the subject matter described herein are set out non-exhaustively in the following numbered clauses:

(1) A method for manufacturing a lead frame, the method comprising:

a) forming a first cavity in a first surface of a metal plate to thereby divide the metal plate into a die pad region and a lead terminal region, wherein a die pad is to be formed in the die pad region, and a lead terminal is to be formed in the lead terminal region;

b) forming a resin layer on the first surface of the metal plate so as to surround the die pad region, wherein the resin layer has an opening portion that exposes a portion of the lead terminal region; and c) forming a second cavity in a second surface of the metal plate such that the second cavity communicates with the first cavity, to thereby obtain the die pad and the lead terminal.

(2) The method according to clause (1), wherein, in the step (b), the resin layer is formed to cover the lead terminal region and the first cavity, and the opening portion exposes one surface of the lead terminal region corresponding to the first surface of the metal plate.

(3) The method according to clause (1), wherein in the step (b), the opening portion exposes a side surface of the first cavity and one surface of the lead terminal region corresponding to the first surface of the metal plate.

(4) The method according to clause (I), further comprising:

d) forming a metal bonding material on a top surface and a side surface of the lead terminal after the step (c).

(5) The method according to clause (1), wherein in the step (b), the resin layer is formed on the first surface using a screen mask and a squeegee that are opposed to the first surface, or the resin layer is formed on the first surface by patterning based on photolithography.

What is claimed is:

1. A lead frame comprising:
   a die pad;
   a lead terminal that is separated from the die pad and disposed around the die pad; and
   a resin layer that is formed between the die pad and the lead terminal so as to fix the die pad and the lead terminal,
   wherein the resin layer has an opening portion that exposes a side surface and a lower surface of the lead terminal so as to provide a clearance between a side wall of the opening portion and the side surface of the lead terminal.

2. The lead frame according to claim 1, wherein
   a side surface of the die pad has a first protrusion,
   a side surface of the lead terminal has a second protrusion opposed to the first protrusion, and
   the resin layer is located below the first protrusion and the second protrusion in a thickness direction of the lead frame.

3. The lead frame according to claim 1, further comprising:
   a metal bonding material that is formed to cover the lower surface and the side surface of the lead terminal.

4. An electronic component device comprising:
   a lead frame comprising:
      a die pad;
      a lead terminal that is separated from the die pad and disposed around the die pad;
      a resin layer that is formed between the die pad and the lead terminal so as to fix the die pad and lead terminal, wherein the resin layer has an opening portion that exposes a side surface and a lower surface of the lead terminal so as to provide a clearance between a side wall of the opening portion and the side surface of the lead terminal; and
      a metal bonding material that is formed to cover the lower surface and the side surface of the lead terminal;
   an electronic component that is disposed on the die pad and electrically connected to the lead terminal; and
   a sealing resin that seals the lead frame and the electronic component.

5. The electronic component device according to claim 4, wherein
   a side surface of the die pad has a first protrusion,
   a side surface of the lead terminal has a second protrusion opposed to the first protrusion, and
   the resin layer is located below the first protrusion and the second protrusion in a thickness direction of the lead frame.

6. A lead frame comprising:
   a die pad;
   a lead terminal that is separated from the die pad and disposed around the die pad; and
   a resin layer that is formed between the die pad and the lead terminal so as to fix the die pad and the lead terminal,
   wherein
   the resin layer has an opening portion that exposes only a lower surface of the lead terminal,
   the resin layer is formed to continuously extend from a side surface of the lead terminal to the lower surface of the lead terminal, the side surface and the lower surface of the lead terminal are directly covered with the resin layer, and a metal plating layer is provided on the lower surface of the lead terminal which is exposed from the opening portion.

7. The lead frame according to claim 6, wherein a side surface of the die pad has a first protrusion, a side surface of the lead terminal has a second protrusion opposed to the first protrusion, and the resin layer is located below the first protrusion and the second protrusion in a thickness direction of the lead frame.

8. An electronic component device comprising:

a lead frame comprising:
- a die pad;
- a lead terminal that is separated from the die pad and disposed around the die pad; and
- a resin layer that is formed between the die pad and the lead terminal so as to fix the die pad and lead terminal, wherein the resin layer has an opening portion that exposes only a lower surface of the lead terminal;

an electronic component that is disposed on the die pad and electrically connected to the lead terminal; and a sealing resin that seals the lead frame and the electronic component, wherein the resin layer is formed to continuously extend from a side surface of the lead terminal to the lower surface of the lead terminal, the side surface and the lower surface of the lead terminal is directly covered with the resin layer, and a metal plating layer is provided on the lower surface of the lead terminal which is exposed from the opening portion.

9. The electronic component device according to claim 8, wherein a side surface of the die pad has a first protrusion, a side surface of the lead terminal has a second protrusion opposed to the first protrusion, and the resin layer is located below the first protrusion and the second protrusion in a thickness direction of the lead frame.

10. The electronic component device according to claim 8, further comprising an electrically conductive ball that is connected to the lower surface of the lead terminal through the opening portion.

* * * * *